(12) United States Patent
Chen

(10) Patent No.: US 9,806,053 B2
(45) Date of Patent: Oct. 31, 2017

(54) SEMICONDUCTOR PACKAGE

(71) Applicant: MEDIATEK Inc., Hsin-Chu (TW)

(72) Inventor: Nan-Jang Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/185,063

(22) Filed: Jun. 17, 2016

(65) Prior Publication Data
US 2016/0300812 A1 Oct. 13, 2016

Related U.S. Application Data

(63) Continuation-in-part of application No. 14/824,210, filed on Aug. 12, 2015, now Pat. No. 9,392,696.
(Continued)

(51) Int. Cl.
*H01L 23/48* (2006.01)
*H01L 23/52* (2006.01)
(Continued)

(52) U.S. Cl.
CPC ............ *H01L 24/49* (2013.01); *H01L 21/48* (2013.01); *H01L 23/3121* (2013.01); *H01L 23/3128* (2013.01); *H01L 23/3675* (2013.01); *H01L 23/60* (2013.01); *H01L 24/17* (2013.01); *H01L 24/73* (2013.01); *H01L 27/32* (2013.01); *H01L 23/49822* (2013.01); *H01L 23/49827* (2013.01); *H01L 23/49833* (2013.01); *H01L 24/13* (2013.01); *H01L 24/16* (2013.01); *H01L 24/32* (2013.01); *H01L 24/33* (2013.01); *H01L 2224/131* (2013.01); *H01L 2224/16225* (2013.01); *H01L 2224/32225* (2013.01); *H01L 2224/32245* (2013.01);
(Continued)

(58) Field of Classification Search
CPC ..... H01L 23/4824; H01L 24/30; H01L 24/49; H01L 23/49838
USPC .......................................................... 257/774
See application file for complete search history.

(56) References Cited

U.S. PATENT DOCUMENTS 6,833,611 B2    12/2004    Liu et al.
6,833,615 B2    12/2004    Geng et al.
(Continued)

FOREIGN PATENT DOCUMENTS

CN    1485893 A    3/2004
CN    1750259 A    3/2006
(Continued)

OTHER PUBLICATIONS

SIPO Office Action dated Nov. 8, 2016 in Chinese application (No. 201410531137.X).
(Continued)

*Primary Examiner* — David S Blum
(74) *Attorney, Agent, or Firm* — McClure, Qualey & Rodack, LLP

(57) ABSTRACT

A semiconductor package includes a first substrate, a first conductive layer, a first surface mount device (SMD) and a first bonding wire. The first substrate has a first top surface. The first conductive layer is formed on the first top surface and has a first conductive element and a second conductive element separated from each other. The first SMD is mounted on the first top surface, overlapping with but electrically isolated from the first conductive element. The first bonding wire electrically connects the first SMD with the first conductive layer.

20 Claims, 18 Drawing Sheets

Related U.S. Application Data which is a continuation-in-part of application No. 14/051,548, filed on Oct. 11, 2013, now Pat. No. 9,147,664.

(51) Int. Cl.

| | | |
|---|---|---|
| *H01L 29/40* | (2006.01) | |
| *H01L 23/00* | (2006.01) | |
| *H01L 23/367* | (2006.01) | |
| *H01L 27/32* | (2006.01) | |
| *H01L 23/60* | (2006.01) | |
| *H01L 23/31* | (2006.01) | |
| *H01L 21/48* | (2006.01) | |
| *H01L 23/498* | (2006.01) | |
| *H05K 3/22* | (2006.01) | |

(52) U.S. Cl.
CPC ........ *H01L 2224/33181* (2013.01); *H01L 2224/48091* (2013.01); *H01L 2224/48106* (2013.01); *H01L 2224/48227* (2013.01); *H01L 2224/73204* (2013.01); *H01L 2224/73253* (2013.01); *H01L 2924/00014* (2013.01); *H01L 2924/01013* (2013.01); *H01L 2924/01029* (2013.01); *H01L 2924/01046* (2013.01); *H01L 2924/01047* (2013.01); *H01L 2924/01078* (2013.01); *H01L 2924/01079* (2013.01); *H01L 2924/12042* (2013.01); *H01L 2924/141* (2013.01); *H01L 2924/1421* (2013.01); *H01L 2924/1432* (2013.01); *H01L 2924/15311* (2013.01); *H01L 2924/181* (2013.01); *H01L 2924/19011* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01); *H01L 2924/19107* (2013.01); *H05K 3/222* (2013.01); *H05K 2201/10287* (2013.01); *H05K 2201/10977* (2013.01); *H05K 2203/049* (2013.01)

(56) References Cited

U.S. PATENT DOCUMENTS

| | | |
|---|---|---|
| 7,009,297 B1 | 3/2006 | Chiang et al. |
| 2002/0047772 A1 | 4/2002 | Chang et al. |
| 2004/0032019 A1 | 2/2004 | Liu et al. |
| 2005/0035448 A1 | 2/2005 | Hsu et al. |
| 2006/0134828 A1 | 6/2006 | Kummerl |
| 2008/0305579 A1 | 12/2008 | Lin et al. |
| 2010/0295168 A1 | 11/2010 | Feng et al. |
| 2014/0240945 A1 | 8/2014 | Hosseini et al. |

FOREIGN PATENT DOCUMENTS

| | | |
|---|---|---|
| CN | 101083246 A | 12/2007 |
| CN | 101325164 A | 12/2008 |
| CN | 101728368 A | 6/2010 |

OTHER PUBLICATIONS

International Search Report dated Jul. 8, 2014.
"Spirent Communications"; Performance Analysis Broadband Division—Honolulu Development Center; PCB CAD Design Guidelines; Document 001-7001-001;Oct. 18, 2002.
CN Office Action dated Apr. 13, 2017 in Chinese application (No. 201410531137.X).

SEMICONDUCTOR PACKAGE

This application is a continuation-in-part application of U.S. application Ser. No. 14/824,210, now U.S. Pat. No. 9,392,696, filed on Aug. 12, 2015, which is a continuation-in-part application of U.S. application Ser. No. 14/051,548, now U.S. Pat. No. 9,147,664, filed Oct. 11, 2013. The entire disclosures of U.S. application Ser. No. 14/824,210 and U.S. application Ser. No. 14/051,548 are incorporated herein by reference.

BACKGROUND

Technical Field

The disclosure relates in general to a package structure, and more particularly to a semiconductor package.

Description of the Related Art

In the electronics industry, high integration and multiple functions with high performance become essential for new products. And meanwhile, high integration may cause higher manufacturing cost, since the manufacturing cost is in proportional to its size. Therefore, demanding on miniaturization of integrated circuit (IC) packages has become more and more critical.

System-in-package (SiP) is now the fastest growing semiconductor package technology since it is a cost-effective solution to high-density system integration in a single package, such as the flip-chip ball grid array (FC-BGA) package or the wire-bonded BGA (WB-BGA) package. In a system-in-package structure, various device components are integrated in a single semiconductor package to reduce the size. Accordingly, there exists a need to provide a semiconductor package to overcomes, or at least reduces the above-mentioned problems.

SUMMARY

In one embodiment of the invention, a semiconductor package is provided. The semiconductor package includes a substrate, a first pad, a second pad, a first conductive element, a surface mount device, a first bonding wire, a second conductive element, a solder resistance layer and a heat-sink. The first pad is formed on the substrate. The second pad is formed on the substrate. The first conductive element is formed on the substrate. The surface mount device is mounted on the first pad and the second pad. The first bonding wire electrically connects a first bonding area of the first conductive element with a second bonding area of the first pad. The second conductive element is formed on the substrate and formed between the first pad and the first conductive element. The solder resistance layer covers a portion of the first bonding area and a portion of the second bonding area. The heat-sink is mounted on the substrate and has at least one cavity to accommodate the first pad, the second pad, a portion of the first conductive element, the bonding wire and the surface mount device.

Yet, in another embodiment of the invention, a semiconductor package is provided. The semiconductor package includes a substrate, a first pad, a second pad, a via-plug, a surface mount device and a heat-sink. The first pad is formed on the substrate. The second pad is formed on the substrate. The via-plug is formed in the substrate, covered by a solder resistance layer, located in a space between the first pad and the second pad, and electrically connected to the second pad. The surface mount device is mounted on the first pad and the second pad. The heat-sink is mounted on the substrate, having at least one cavity to accommodate the first pad, the second pad, a portion of the solder resistance layer and the surface mount device.

In yet another embodiment of the present invention, a semiconductor package is provided. The semiconductor package includes a substrate, a first conductive layer, a second conductive layer, a first surface mount device, a second surface mount device and a connection element. The first conductive layer is formed on the substrate and has a first pad and a second pad separated from the first pad. The second conductive layer is formed on the substrate and has a third pad and a fourth pad electrically connected with the third pad through the second conductive layer. The first surface mount device is mounted on the first pad and the third pad. The second surface mount device is mounted on the second pad and the fourth pad. The connection element electrically connects the first pad with the second pad.

In yet another embodiment of the present invention, a semiconductor package is provided. The semiconductor package includes a substrate, a first conductive layer, a second conductive layer, a first surface mount device, a second surface mount device, a first connection element and a second connection element. The first conductive layer is formed on the substrate and has a first pad and a second pad separated from the first pad. The second conductive layer is formed on the substrate and has a third pad and a fourth pad separated from the third pad. The first surface mount device is mounted on the first pad and the third pad. The second surface mount device is mounted on the second pad and the fourth pad. The first connection element electrically connects the first pad with the second pad. The second connection element electrically connects the third pad with the fourth pad.

In yet another embodiment of the present invention, a semiconductor package is provided. The semiconductor package includes a substrate, a first conductive layer, a second conductive layer, a connection element, a first surface mount device and a second surface mount device. The first conductive layer is formed on the substrate and has a first pad and a second pad separated from the first pad. The connection element electrically connecting the first pad with the second pad. The second conductive layer is formed on the substrate and has a third pad, a fourth pad and a fifth pad electrically connecting with each other through the second conductive layer. The first surface mount device is mounted on the first pad, the third pad and the fourth pad. The second surface mount device is mounted on the second pad and the fifth pad.

In yet another embodiment of the present invention, a semiconductor package is provided. The semiconductor package includes a first substrate, a first conductive layer, a first surface mount device (SMD) and a first bonding wire. The first substrate has a first top surface. The first conductive layer is formed on the first top surface and has a first conductive element and a second conductive element separated from each other. The first SMD is mounted on the first top surface, overlapping with but electrically isolated from the first conductive element. The first bonding wire is electrically connect the first SMD with the first conductive layer.

DETAILED DESCRIPTION

Figure 1A:
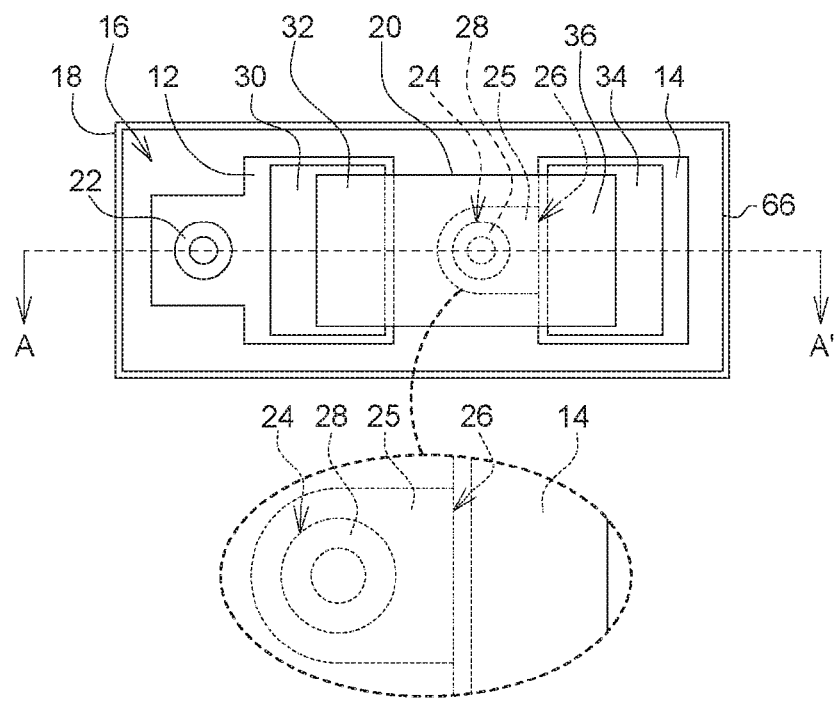
FIG. 1A illustrates a top view of a semiconductor package in one embodiment of the invention.
Figure 1B:
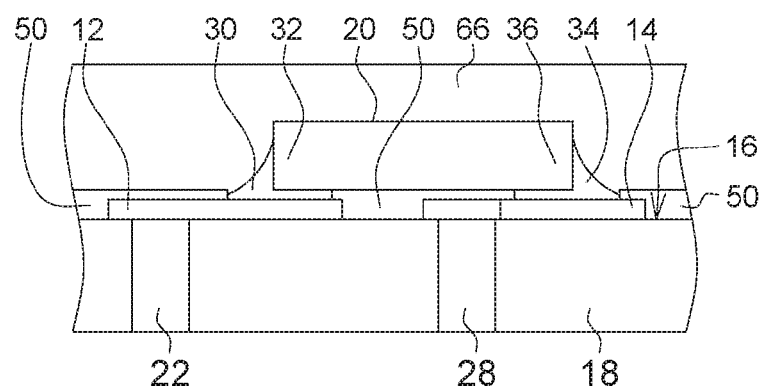
FIG. 1B illustrates a cross-section view of a semiconductor package in one embodiment of the invention.

FIG. 1A illustrates a top view of a semiconductor package in one embodiment of the invention. FIG. 1B illustrates a cross-section view of the semiconductor package drawn along AA' line in FIG. 1A.

Referring to FIG. 1A and FIG. 1B, a first pad 12 and a second pad 14 are disposed on a surface 16 of a substrate 18. The substrate 18 may be a printed circuit board (PCB), a semiconductor carrier board, or a package substrate such as a ball grid arrays (BGA) substrate or a pin grid array (PGA) substrate.

Referring to FIG. 1A and FIG. 1B, via-plugs 22, 28 passing through the substrate 18 are respectively electrically connected to the first pad 12 and the second pad 14, and may be electrically connected to conductive elements such as traces (not shown) on at least one other surface of the substrate 18. In one embodiment, the via-plugs 22, 28 passing through the whole substrate 18 are formed by a method comprising forming openings in the substrate by drilling, etching or emitting laser, and then filling the openings with a conductive material e.g. copper, aluminum, etc.

In one embodiment, the via-plug 28 is formed in a space between the first pad 12 and the second pad 14. And the via-plug 28 electrically connects to the second pad 14. Therefore, the space between the first pad 12 and the second pad 14 is used. It results in facilitating miniaturization of IC packages, or increasing of an extra area for additional elements or devices. Therefore, design flexibility of the semiconductor package is enhanced.

In one embodiment, the via-plug 28 is electrically connected to the second pad 14 through a connecting member 25, as shown in an enlarge view in FIG. 1A. Referring to FIGS. 1A and 1B, the connection member 25 may be formed together with the second pad 14. The via-plug 28 and the connection member 25 are covered by a solder resistance layer 50 (shown in FIG. 1B, but not shown in FIG. 1A for the sake of brevity). At least a portion of the first pad 12 and the second pad 14 is not covered by the solder resistance layer 50 (FIG. 1B) so as to reveal openings. In embodiments, the via-plug 28 and the second pad 14 are respectively formed in non-overlapping areas of the substrate 18, as shown in FIG. 1A. In other word, the via-plug 28 is independent from the second pad 14. An outline 24 of the via-plug 28 is generally a circle; an outline 26 of the second pad 14 is generally a square, but not limited thereto. The outline 24 of the via-plug 28 is independent from the outline 26 of the second pad 14. In other words, the outline 24 and the outline 26 are non-overlapping. In one embodiment, the outline 24 of the via-plug 28 and the outline 26 of the second pad 14 are separated by the connecting member 25.

Referring to FIGS. 1A and 1B, a surface mount device (SMD device) 20 may be mounted on the first pad 12 and the second pad 14 on the surface 16 of the substrate 18. The SMD device 20 may be a passive device e.g. capacitor, resistor, inductor or electrostatic discharge (ESD) component. The SMD device 20 includes a first electrode 32 and a second electrode 36, which are respectively electrically connected to the first pad 12 through a first solder 30 and connected to the second pad 14 through a second solder 34. The SMD device 20 overlaps with the via-plug 28. In other word, the via-plug 28 is placed under the SMD device 20.

For example, the SMD device 20 is mounted on the surface 16 of the substrate 18 by a reflow process. In the beginning of the reflow process, a solder paste layer is printed in the openings defined by the solder resistance layer 50 on the first pad 12 and the second pad 14. The SMD device 20 then is mounted on the surface 16 by putting the first electrode 32 of the SMD device 20 on the solder paste layer which is printed on the first pad 12, and putting the second electrode 36 of the SMD device 20 on the solder paste layer which is printed on the second pad 14. Thereafter, the substrate 18 and the SMD device 20 are heated by a reflow oven. During the heating process, the solder paste layer is melted to form the first solder 30 and the second solder 34. After cooling down, the first solder 30 and the second solder 34 firmly fix the SMD device 20 to the first pad 12 and the second pad 14.

In one embodiment, one of the first pad 12 and the second pad 14 is a power pad, and the other one is a ground pad. For example, the first pad 12 is the power pad, and the second pad 14 is the ground pad.

A molding compound layer 66 covers the substrate 18 and structures on the surface 16 of the substrate 18, so that various components such as the first pad 12, the second pad 14, the SMD device 20 etc., are encapsulated and protected from mechanical and/or chemical damages, e.g. moisture, oxidization, external shocks and vibrations. The molding compound layer 66 may include an epoxy resin or other suitable materials. In embodiments, the semiconductor package also includes other components not shown in FIGS. 1A and 1B.

Figure 2A:
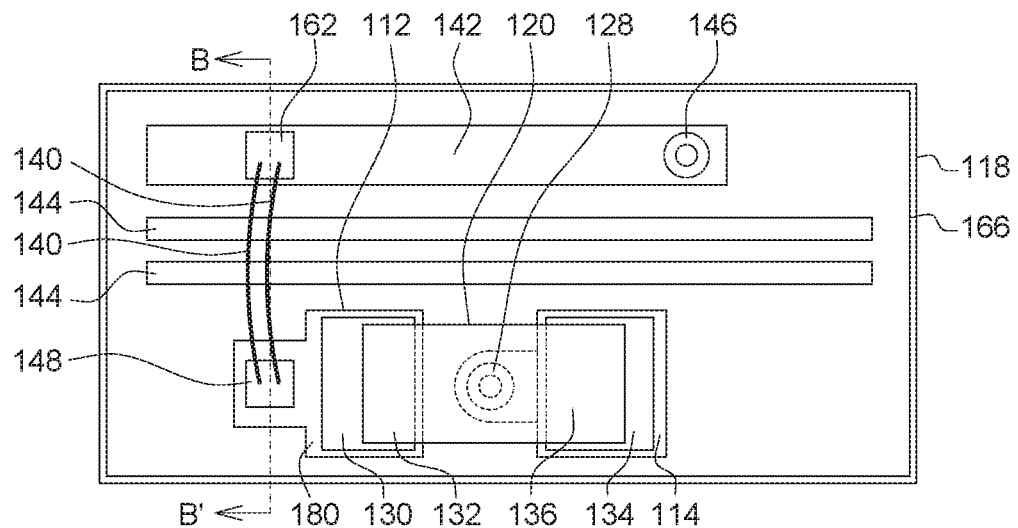
FIG. 2A illustrates a top view of a semiconductor package in one embodiment of the invention.
Figure 2B:
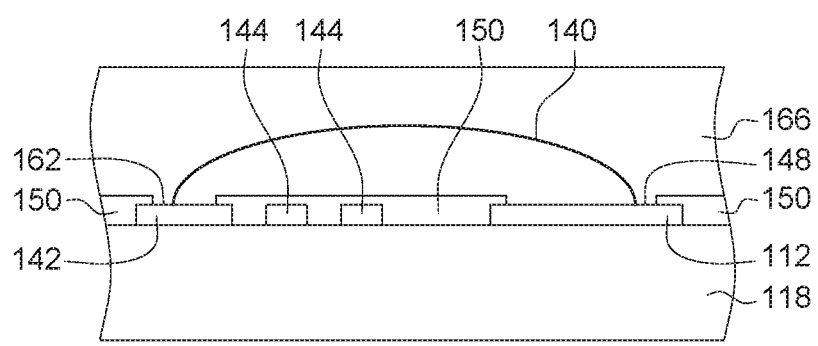
FIG. 2B illustrates a cross-section view of a semiconductor package in one embodiment of the invention.

FIG. 2A illustrates a top view of a semiconductor package in another embodiment of the invention. FIG. 2B illustrates a cross-section view of the semiconductor package drawn along BB' line in FIG. 2A.

The semiconductor package as shown in FIG. 2A includes a substrate 118. The substrate 118 may be a printed circuit board (PCB), a semiconductor carrier board, or a package substrate such as a ball grid arrays (BGA) substrate or a pin grid array (PGA) substrate. A surface mount device (SMD device) 120 may be mounted on a first pad 112 and a second pad 114 on the substrate 118 through a first solder 130 and a second solder 134, respectively electrically connected between a first electrode 132 of the SMD device 120 and the first pad 112 and between a second electrode 136 of the SMD device 120 and the second pad 114. The SMD device 120 may be a passive device e.g. capacitor, resistor, inductor or electrostatic discharge (ESD) component.

As shown in FIG. 2A, the semiconductor package further includes a first conductive element 142 and maybe a second conductive element 144 formed on the substrate 118. The first conductive element 142 is formed physically independent from the first pad 112. The second conductive element 144 may be formed in between the first pad 112 and the first conductive element 142, and are separated from etch other, for example by an insulating layer such as a solder resistance layer 150 (FIG. 2B).

The first conductive element 142 electrically connects to a via-plug 146 formed through the substrate 118, and electrically connects to the first pad 112 through at least one bonding wire 140 lying across the second conductive element 144. In one embodiment, two opposing ends of the bonding wire 140 are respectively bonded on a first bonding area 148 connecting to the first pad 112 and a second bonding area 162 of the first conductive element 142. The first bonding area 148 and the second bonding area 162 are defined by the solder resistance layer 150 (shown in FIG. 2B, but not shown in FIG. 2A for the sake of brevity) which covers a portion of the substrate 118 and reveals some openings for soldering or wire bonding. The via-plugs 146, 128 (FIG. 2A) are formed through the substrate 118 and respectively electrically connected to the first conductive element 142 and the second pad 114.

As disclosed above, the SMD device 120 is mounted on the substrate 118 by reflow process. In order to prevent a solder paste material from flowing into the first bonding area 148, the solder resistance layer (not shown) may be used to cover an area 180 between the first bonding area 148 and the first pad 112.

In one embodiment, the first conductive element 142 and the second conductive element 144 may be a trace, a pad, a ring, or a finger. One of the first conductive element 142 and the second pad 114 is used for distributing power signal, and the other of the first conductive element 142 and the second pad 114 is used for connecting to a ground potential. For example, the second pad 114 is a ground pad. The first conductive element 142 is a power trace, a power ring, a power plane, or a power finger, electrically connected to the via-plug 146 or to the bonding pad on a semiconductor (not shown in FIG. 2A for the sake of brevity). In additional, the second conductive element 144 is a signal trace for distributing signal.

A molding compound layer 166 encapsulates structures on the substrate 118 such as the first pad 112, the second pad 114, the SMD device 120, the first conductive element 142, the second conductive element 144, etc., to protect them from mechanical and/or chemical damages, e.g. moisture, oxidization, external shocks and vibrations.

Figure 3A:
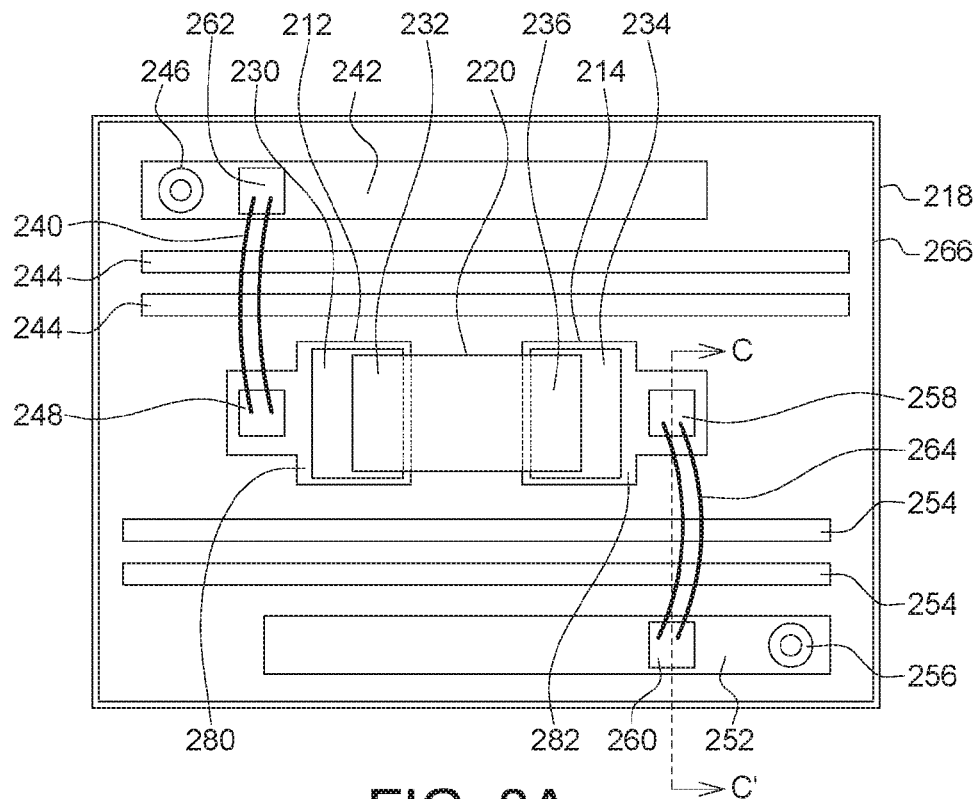
FIG. 3A illustrates a top view of a semiconductor package in one embodiment of the invention.
Figure 3B:
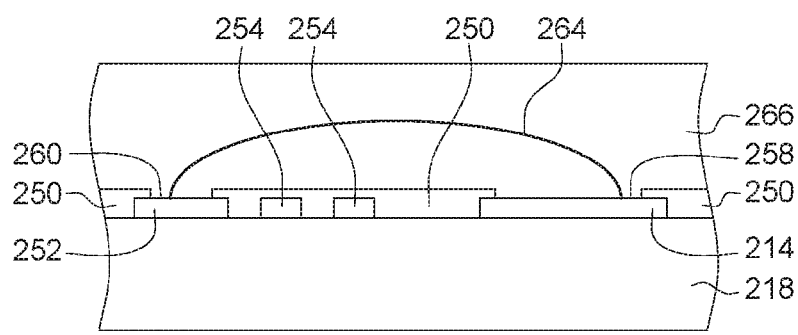
FIG. 3B illustrates a cross-section view of a semiconductor package in one embodiment of the invention.

FIG. 3A illustrates a top view of a semiconductor package in one embodiment of the invention. FIG. 3B illustrates a cross-section view of the semiconductor package drawn along CC' line in FIG. 3A.

The semiconductor package as shown in FIG. 3A includes a substrate 218. A surface mount device (SMD device) 220 may be mounted on a first pad 212 and a second pad 214 on the substrate 218 through a first solder 230 and a second solder 234, respectively electrically connected between a first electrode 232 of the SMD device 220 and the first pad 212 and between a second electrode 236 of the SMD device 220 and the second pad 214.

As shown in FIG. 3A, the semiconductor package further includes a first conductive element 242, a second conductive element 244, a third conductive element 252, and a fourth conductive element 254, formed on the substrate 218. The second conductive elements 244 are formed between the first pad 212 and the first conductive element 242, and are separated from each other, for example by an insulating layer such as a solder resistance layer 250 (FIG. 3B). The fourth conductive elements 254 are formed between the second pad 214 and the third conductive element 252, and are separated from each other, for example by an insulating layer such as the solder resistance layer 250 (FIG. 3B).

Moreover, the first conductive element 242 electrically connects to a via-plug 246 formed through the substrate 218, and electrically connects to the first pad 212 through at least one bonding wire 240 lying across the second conductive element 244. In one embodiment, two opposing ends of the bonding wire 240 are respectively bonded on a first bonding area 248 connecting to the first pad 212 and a second bonding area 262 of the first conductive element 242. The third conductive element 252 electrically connects to a via-plug 256 formed through the substrate 218, and electrically connects to the second pad 214 through at least one bonding wire 264 lying across the fourth conductive element 254. In one embodiment, two opposing ends of the bonding wire 264 are respectively bonded on a third bonding area 258 connecting to the second pad 214 and a fourth bonding area 260 of the third conductive element 252. In one embodiment, for example, the first bonding area 248, the second bonding area 262, the third bonding area 258 and the fourth bonding area 260 are defined by (or exposed by openings of) the solder resistance layer 250 (shown in FIG. 3B, but not shown in FIG. 3A for the sake of brevity).

As disclosed above, the SMD device 220 is mounted on the substrate 218 by reflow process. In order to prevent a solder paste material from flowing into the first bonding area 248 and the third bonding area 258, a solder resistance layer (not shown) may be used to cover an area 280 between the first bonding area 248 and the first pad 212, and cover an area 282 between the third bonding area 258 and the second pad 214.

Referring to FIG. 3A, one of the first conductive element 242 and the third conductive element 252 is used for distributing a power signal and the other of the first conductive element 242 and the third conductive element 252 is used for connecting to a ground potential. For example, the first conductive element 242 is a power trace, a power ring, a power plane, or a power finger, electrically connected to the via-plug 246. The third conductive element 252 is a ground trace, a ground ring, or a ground pad, electrically connected to the via-plug 256 or to the bonding pad on a semiconductor (not shown in FIG. 3A for the sake of brevity). The second conductive element 244 and the fourth conductive element 254 are signal traces for distributing signals.

A molding compound layer 266 encapsulates structures on the substrate 218 such as the first pad 212, the second pad 214, the SMD device 220, the first conductive element 242, the second conductive element 244, etc., to protect them from mechanical and/or chemical damages, e.g. moisture, oxidization, external shocks and vibrations.

Figure 4A:
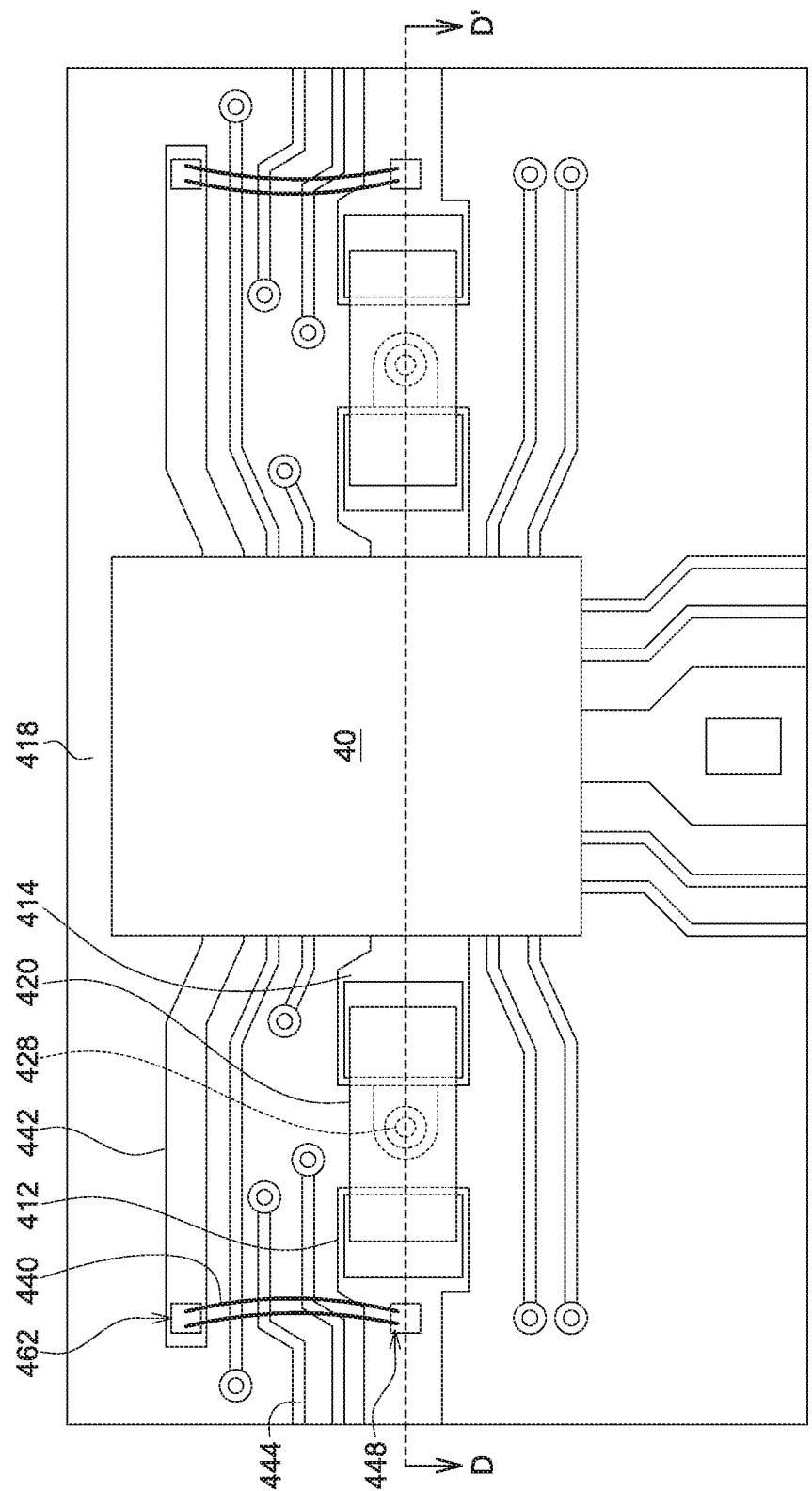
FIG. 4A is a top view illustrating a semiconductor package in accordance with one embodiment of the invention.
Figure 4B:
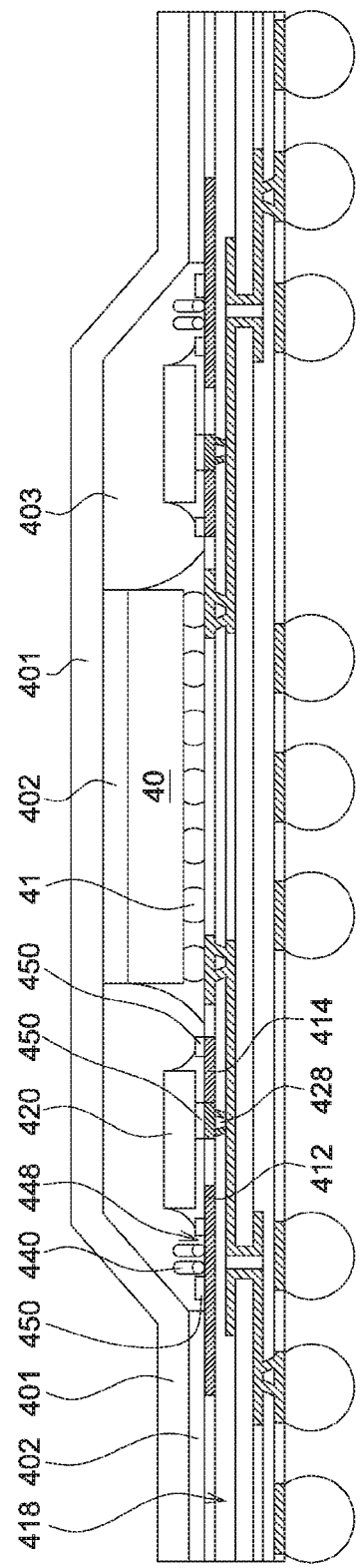
FIG. 4B is a cross-sectional view of the semiconductor package taken along DD' line depicted in FIG. 4A.

In some embodiments of the present invention, the semiconductor package further includes a heat-sink is mounted on the substrate. FIG. 4A is a top view illustrating a semiconductor package, named flip-chip ball grid array (FC-BGA) package, in accordance with one embodiment of the invention. FIG. 4B is a cross-sectional view of the semiconductor package taken along DD' line depicted in FIG. 4A. The structure of the semiconductor package depicted in FIG. 4 is similar to that of the semiconductor packages depicted in FIGS. 2A-2B, except that the semiconductor package of the present embodiment further has a heat-sink 401 (shown in FIG. 4B, but not shown in FIG. 4A for the sake of brevity) mounted on the substrate 418 rather than being encapsulated by a molding compound.

As shown in FIGS. 4 A and 4B, the semiconductor package includes a substrate 418, a first pad 412, a second pad 414, a first conductive element 442, a surface mount device (SMD) 420, a first bonding wire 440, a second conductive element 444, a solder resistance layer 450, a via-plug 428 and a heat-sink 401. The first pad 412, the second pad 414, the first conductive element 442 are formed on the substrate 418. The surface mount device 420 is mounted on the first pad 412 and the second pad 414. The first bonding wire 440 electrically connects a first bonding area 462 of the first conductive element 442 with a second bonding area 448 of the first pad 412. The second conductive element 444 is formed on the substrate 418 and formed between the first pad 412 and the first conductive element 442. The via-plug 428 formed in the substrate 418, covered by a solder resistance layer 450, located in a space between the first pad 412 and the second pad 414, and electrically connected to the second pad 414.

In the present embodiment, the semiconductor package further includes a flip chip 40, such as a processing unit (CPU), bonded on the substrate 418 with solder bumps 41 and the surface mount device 420 may serve as a decoupling capacitor, disposed adjacent to the chip 40. The heat-sink 401 is mounted on a portion of the substrate 418 and the chip 40 by a thermal compound 402, and at least one cavity 403 are thus defined among the heat-sink 401, the chip 40 and the substrate 418 to accommodate the first pad 412, the second pad 414, a portion of the solder resistance layer 450 and the surface mount device 420 formed therein.

In one embodiment, one of the first pad 412 and the second pad 414 is a power pad, and the other one is a ground pad. The surface mount device 420 is a decoupling capacitor. For example, the first pad 412 is the power pad, and the second pad 414 is the ground pad.

Figure 5A:
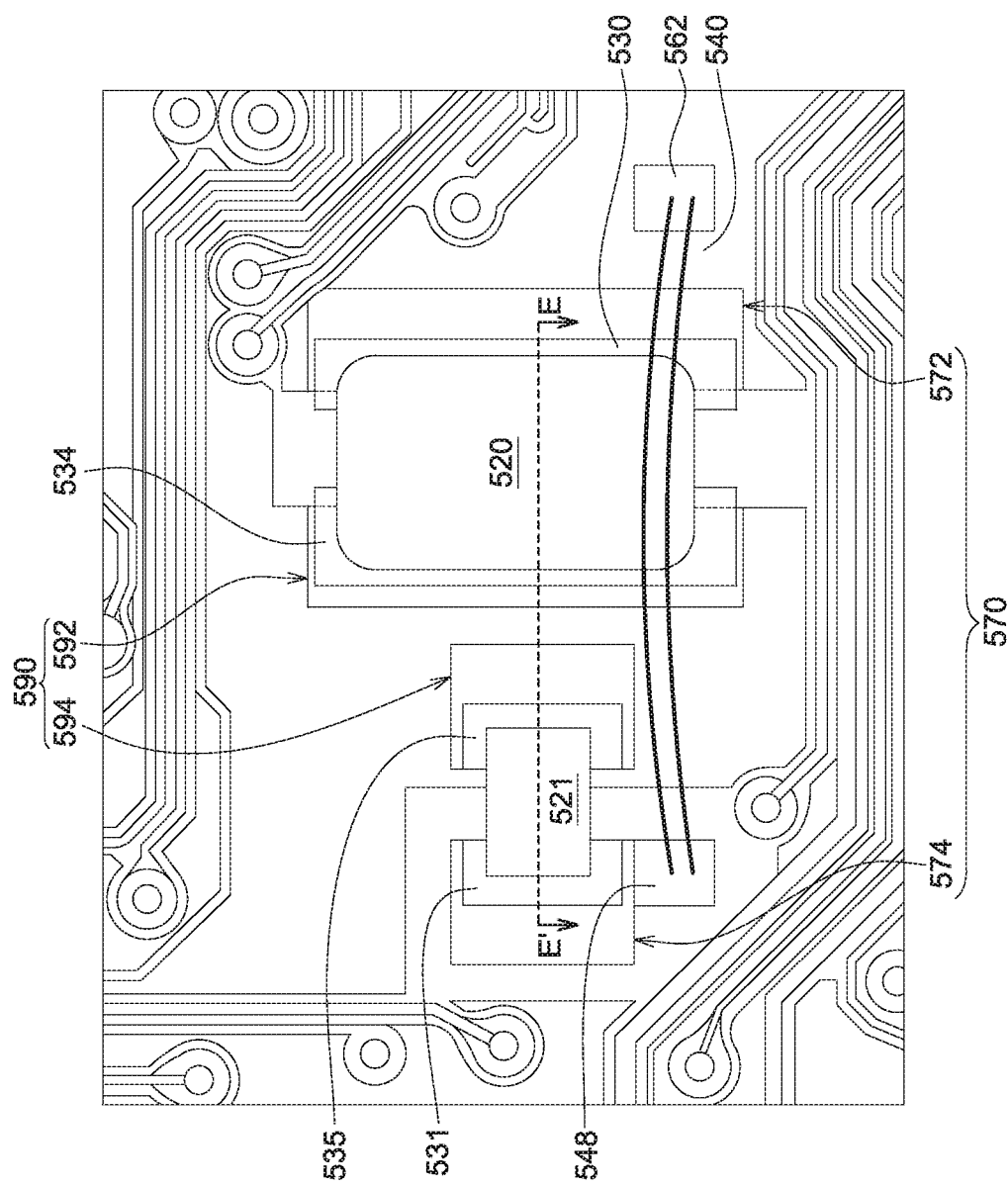
FIG. 5A is a top view illustrating a semiconductor package in accordance with one embodiment of the invention.
Figure 5B:
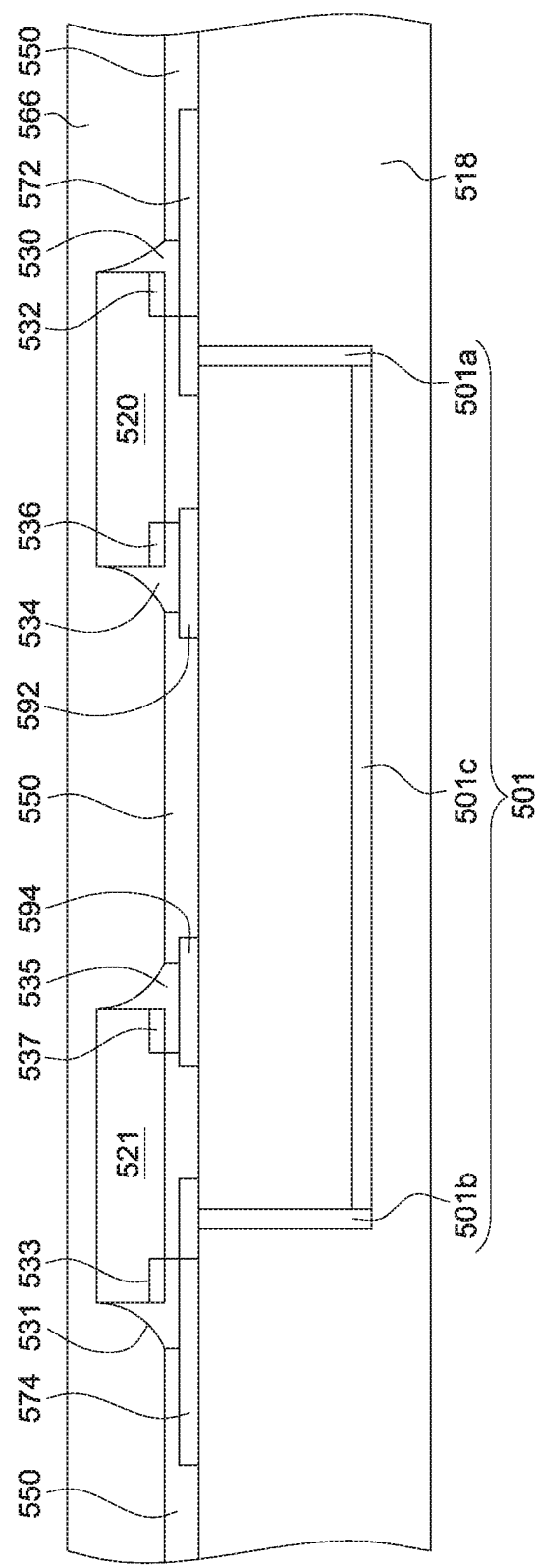
FIG. 5B is a cross-sectional view of the semiconductor package taken along EE' line depicted in FIG. 5A.

FIG. 5A is a top view illustrating a semiconductor package, which may be a FC-BGA package shown in FIG. 4 or a wire-bonded BGA package (not shown), in accordance with one embodiment of the invention. FIG. 5B is a cross-sectional view of the semiconductor package taken along EE' line depicted in FIG. 5A. As shown in FIG. 5A, the semiconductor package includes a substrate 518 having a first patterned conductive layer 570 and a second patterned conductive layer 590 formed thereon. The first patterned conductive layer 570 at least has a first pad 572 and a second pad 574 separated from the first pad 572; and the second patterned conductive layer 590 has a third pad 592 and a fourth pad 594 electrically connected with each other through the second patterned conductive layer 590. In other words, in the present embodiment, the first pad 572 and the second pad 574 has an identical level nevertheless they are not connected with each other; and the third pad 592 and the fourth pad 594 are defined on a continuous layer with the same level.

A first surface mount device (SMD device) 520 disposed on the substrate 518 may be mounted on the first pad 572 and the third pad 592 through a first solder 530 and a second solder 534, wherein the first solder 530 electrically connects a first electrode 532 of the surface mount device 520 with the first pad 572, and the second solder 534 electrically connects a second electrode 536 of the surface mount device 520 with the third pad 592. A second surface mount device 521 disposed on the substrate 518 may be mounted on the second pad 574 and the fourth pad 594 through a third solder 531 and a fourth solder 535, wherein the third solder 531 electrically connects a third electrode 533 of the second surface mount device 521 with the second pad 574, and the fourth solder 535 electrically connects a fourth electrode 537 of the second surface mount device 521 with the fourth pad 594 (shown in FIG. 5B, but not shown in FIG. 5 for the sake of brevity).

In some embodiments of the present invention, the first surface mount device 520 has a size substantially equal to that of the second surface mount device 521. But in the present embodiment, the first surface mount device 520 has a size substantially greater than that of the second surface mount device 521.

The first pad 572 electrically connects to the second pad 574 through at least one bonding wire 540. In one embodiment, two opposing ends of the bonding wire 540 are respectively bonded on a first bonding area 562 of the first pad 572 and a second bonding area 548 of the second pad 574. The first bonding area 562 and the second bonding area 548 are defined by a solder resistance layer 550 (shown in FIG. 5B, but not shown in FIG. 5A for the sake of brevity) which covers a portion of the first pad 572 and the second pad 574 to reveal some openings for soldering or wire bonding. In the present embodiment, the bonding wire 540 lies across the first surface mount device 520. The more the bonding wires 540 are bonded, the less the impedance between two bonding areas.

In some embodiments of the present invention, an interconnection structure 501 may be used to either substitute the bonding wire 540 or further electrically connect the first pad 572 with the second pad 574. In the present embodiment, the semiconductor package further includes an interconnection structure 501 having a plurality of via-plugs, such as via-plugs 501a and 501b, and a metal layer 501c formed in the substrate 518 used to further improved the electrical connection between the first pad 572 with the second pad 574 to reduce their impedance. The via-plugs 501a and 501b respectively in contact with the first pad 572 and the second pad 574; and one end of the metal layer 501c directly in contact with the via-plug 501a and the other end of the metal layer 501c directly in contact with the via-plug 501b.

In one embodiment, the first surface mount device 520 and the second surface mount device 521 are decoupling capacitors. The first pad 572 and the second pad 574 are the power pads, and the third pad 592 and the fourth pad 594 are the ground pads.

In some embodiments of the present invention, the semiconductor package may further include a molding compound layer 566 (shown in FIG. 5B, but not shown in FIG. 5A for the sake of brevity) encapsulating the structures formed on the substrate 518, such as a portion of the substrate, the first pad 572, the second pad 574, the third pad 592, the fourth pad 594, the bonding wire 540, the first surface mount device 520 and the second surface mount device 521.

Yet, in some embodiments of the present invention, the semiconductor package may further include a heat-sink mounted (like the one as shown in FIG. 4B) on the substrate 518, having at least one cavity 403 to accommodate the first pad 572, the second pad 574, the third pad 592, the fourth pad 594, the bonding wire 540, a portion of the solder resistance layer 550, the first surface mount device 520 and the second surface mount device 521.

Figure 6A:
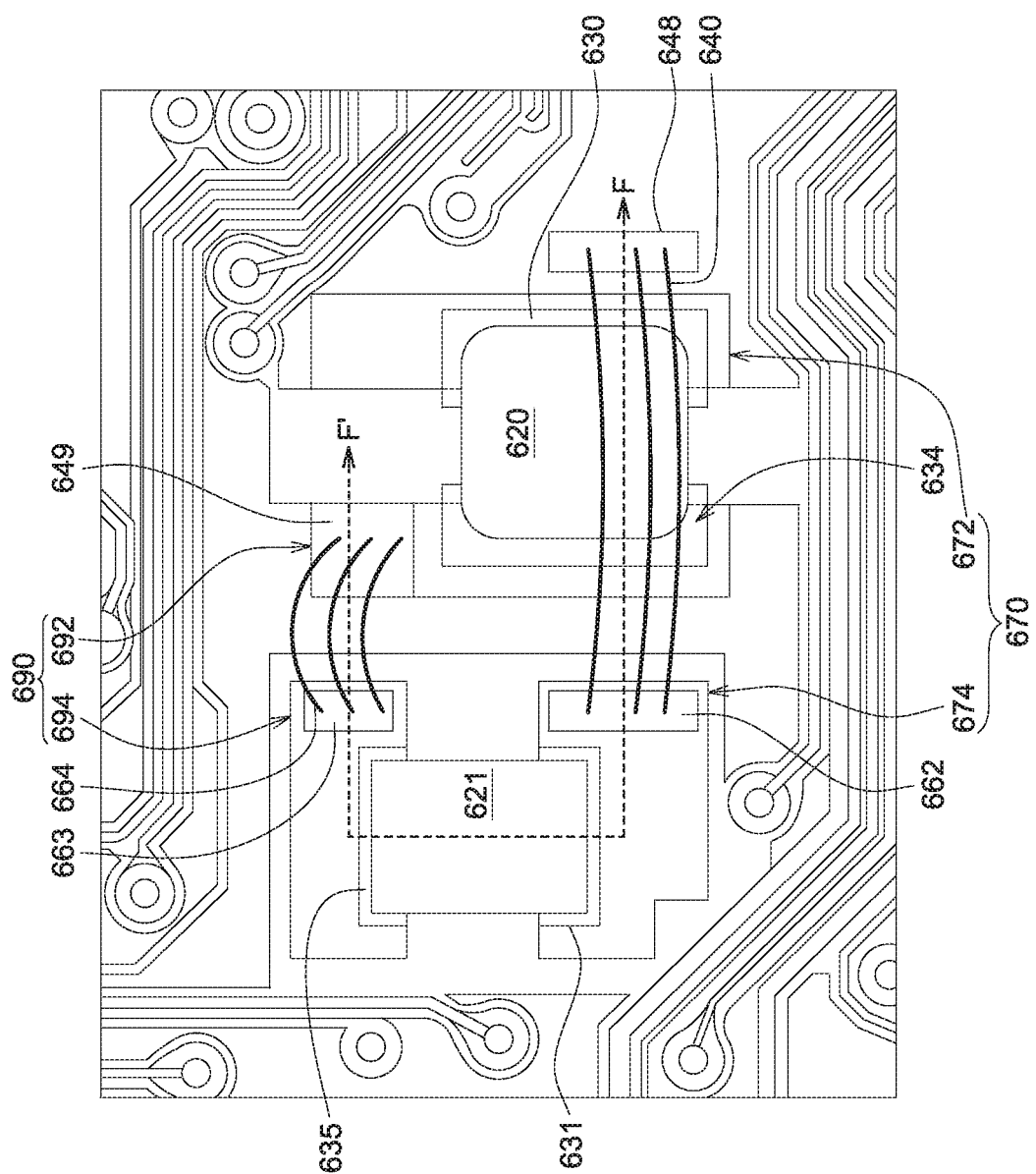
FIG. 6A is a top view illustrating a semiconductor package in accordance with one embodiment of the invention.
Figure 6B:
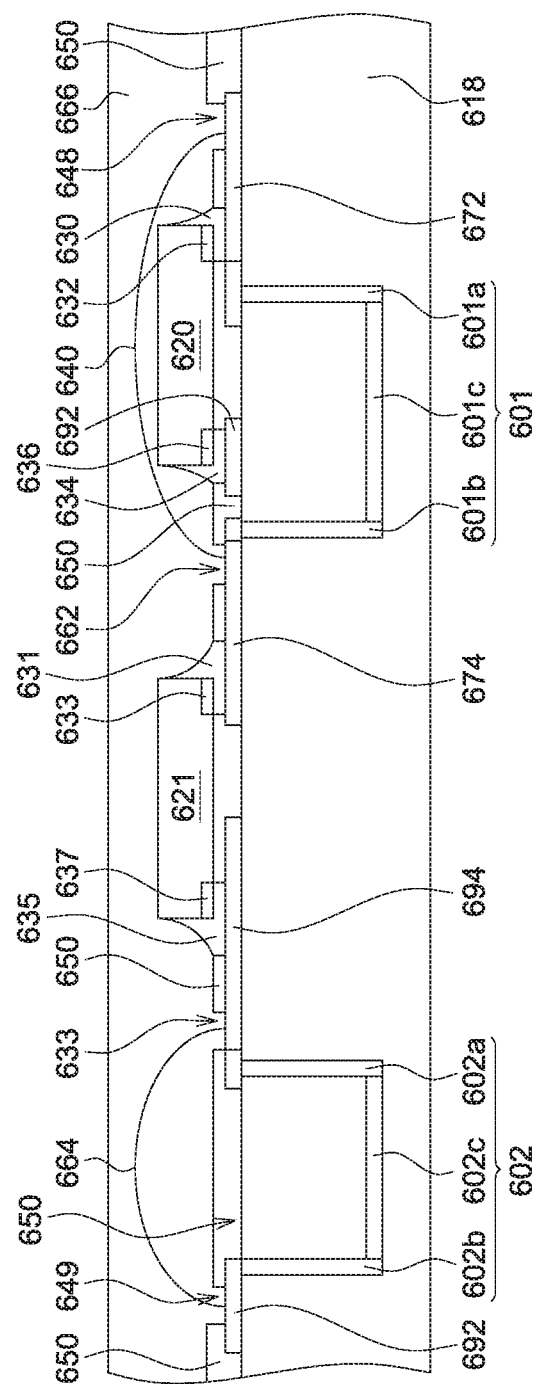
FIG. 6B is a cross-sectional view of the semiconductor package taken along FF' line depicted in FIG. 6A.

FIG. 6A is a top view illustrating a semiconductor package, which may be a FC-BGA package shown in FIG. 4 or a wire-bonded BGA package (not shown), in accordance with one embodiment of the invention. FIG. 6B is a cross-sectional view of the semiconductor package taken along FF' line depicted in FIG. 6A. As shown in FIG. 6A the semiconductor package includes a substrate 618 having a first patterned conductive layer 670 and a second patterned conductive layer 690 formed thereon. The first patterned conductive layer 670 at least has a first pad 672 and a second pad 674 separated from the first pad 672; and the second patterned conductive layer 690 has a third pad 692 and a fourth pad 694 separated from the third pad 692. In other words, in the present embodiment, the first pad 672 and the second pad 674 has an identical level nevertheless they are not connected with each other; and the third pad 692 and the fourth pad 694 are also not connected with each other but has the same level.

A first surface mount device (SMD device) 620 disposed on the substrate 618 may be mounted on a first pad 672 and the third pad 692 through a first solder 630 and a second solder 634, wherein the first solder 630 electrically connects a first electrode 632 of the first surface mount device 620 with the first pad 672, and the second solder 634 electrically connects a second electrode 636 of the first surface mount device 620 with the third pad 692. A second surface mount device 621 disposed on the substrate 618 may be mounted on the second pad 674 and the fourth pad 694 through a third solder 631 and a fourth solder 635. In the present embodiment, the third solder 631 electrically connects a third electrode 633 of the second surface mount device 621 with the second pad 674, and the fourth solder 635 electrically connects a fourth electrode 637 of the second surface mount device 621 with the fourth pad 694 (shown in FIG. 6B, but not shown in FIG. 6A for the sake of brevity).

In some embodiments of the present invention, the first surface mount device 620 has a size substantially equal to that of the second surface mount device 621. But in the present embodiment, the first surface mount device 620 has a size substantially greater than that of the second surface mount device 621.

The first pad 672 electrically connects to the second pad 674 through at least one first bonding wire 640; and the third pad 692 electrically connects to the fourth pad 694 through at least one second bonding wire 664. In one embodiment, two opposing ends of the first bonding wire 640 are respectively bonded on a first bonding area 648 of the first pad 672 and a second bonding area 662 of the second pad 674; and the two opposing ends of the second bonding wire 664 are respectively bonded on a third bonding area 649 of the third pad 692 and a fourth bonding area 663 of the second pad 674. The first bonding area 648, the second bonding area 662, the third bonding area 649 and the fourth bonding area 663 are defined by a solder resistance layer 650 (shown in FIG. 6B, but not shown in FIG. 6A for the sake of brevity) which covers a portion of the first pad 672, the second pad 674, the third pad 692 and the fourth pad 694 to reveal some openings for soldering or wire bonding. In the present embodiment, the first bonding wire 640 lies across the first surface mount device 620. The more the bonding wires 640 and 664 are bonded, the less the impedance between two bonding areas.

In some embodiments of the present invention, the first bonding wire 640 and the second bonding wire 664 may be respectively substituted by an interconnection structure. In one preferred embodiment, the semiconductor package may further include a first interconnection structure 601 and a second interconnection structure 602 respectively used to electrically connect the first pad 672 and the second pad 674 and to electrically connect the third pad 692 and the fourth pad 694 to reduce their impedance.

In the present embodiment, the interconnection structure 601 has a plurality of via-plugs, such as via-plugs 601a and 601b and a metal layer 601c. The via-plugs 601a and 601b respectively in contact with the first pad 672 and the second pad 674; and one end of the metal layer 601c directly in contact with the via-plug 601a and the other end of the metal layer 601c directly in contact with the via-plug 601b. The interconnection structure 602 has a plurality of via-plugs, such as via-plugs 602a and 602b and metal layer 602c. The via-plugs 602a and 602b respectively in contact with the third pad 692 and the fourth pad 694; and one end of the metal layer 602c directly in contact with the via-plug 602a and the other end of the metal layer 602c directly in contact with the via-plug 602b.

In one embodiment, the first surface mount device 620 and the second surface mount device 621 are decoupling capacitors. The first pad 672 and the second pad 674 are the power pads, and the third pad 692 and the fourth pad 694 are the ground pads.

In some embodiments of the present invention, the semiconductor package may further include a molding compound layer 666 (shown in FIG. 6B, but not shown in FIG. 6A for the sake of brevity) encapsulating the structures formed on the substrate 618, such as a portion of the substrate, the first pad 672, the second pad 674, the third pad 692, the fourth pad 694, the first bonding wire 640, the second bonding wire 664, a portion of the solder resistance layer 650, the first surface mount device 620 and the second surface mount device 621.

Yet, in some embodiments of the present invention, the semiconductor package may further include a heat-sink mounted (like the one 401 as shown in FIG. 4B) on the substrate 618, having at least one cavity 403 to accommodate the first pad 672, the second pad 674, the third pad 692, the fourth pad 694, the first bonding wire 640, the second bonding wire 664 the first surface mount device 620 and the second surface mount device 621.

Figure 7A:
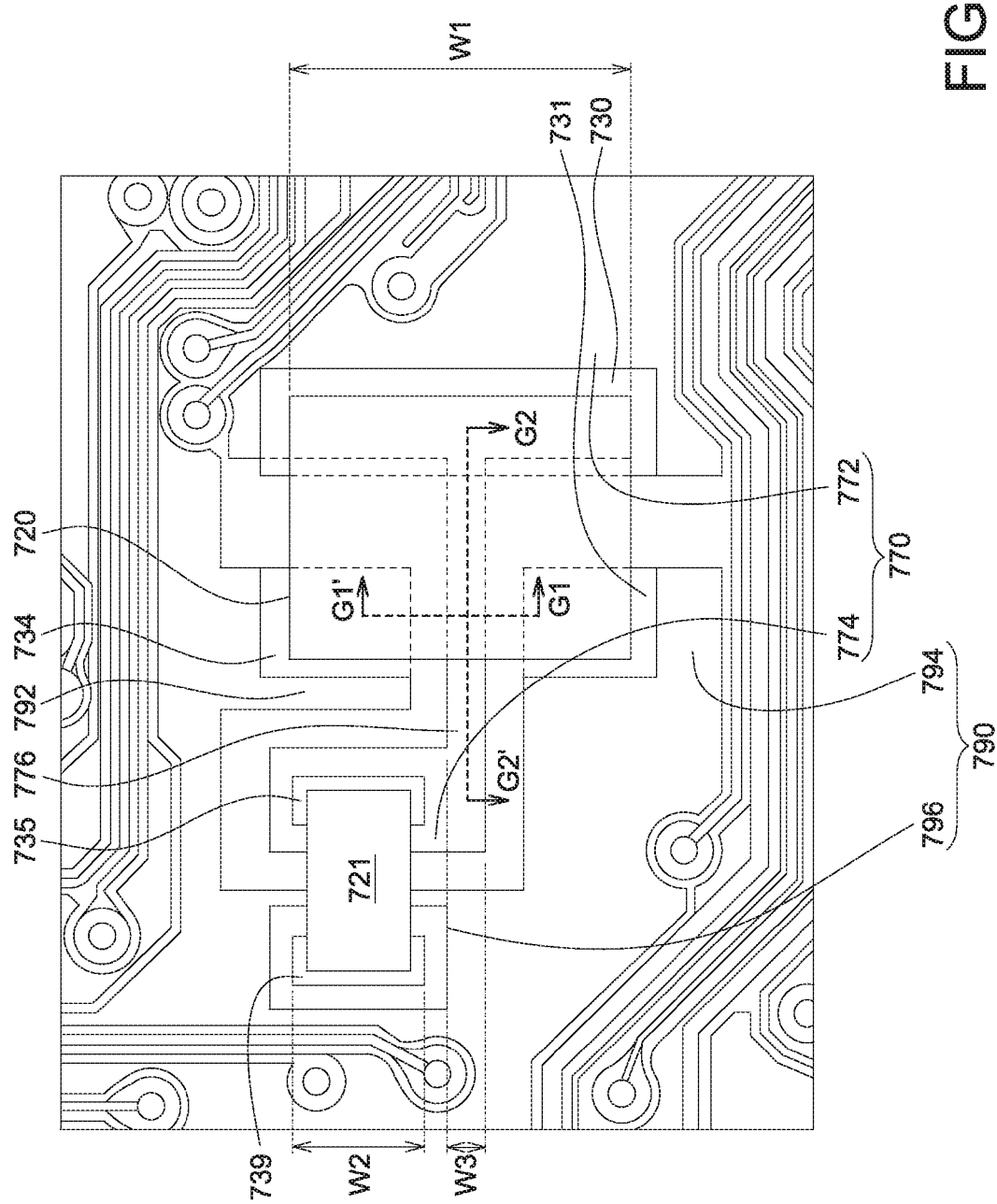
FIG. 7A is a top view illustrating a semiconductor package in accordance with one embodiment of the invention.
Figure 7B:
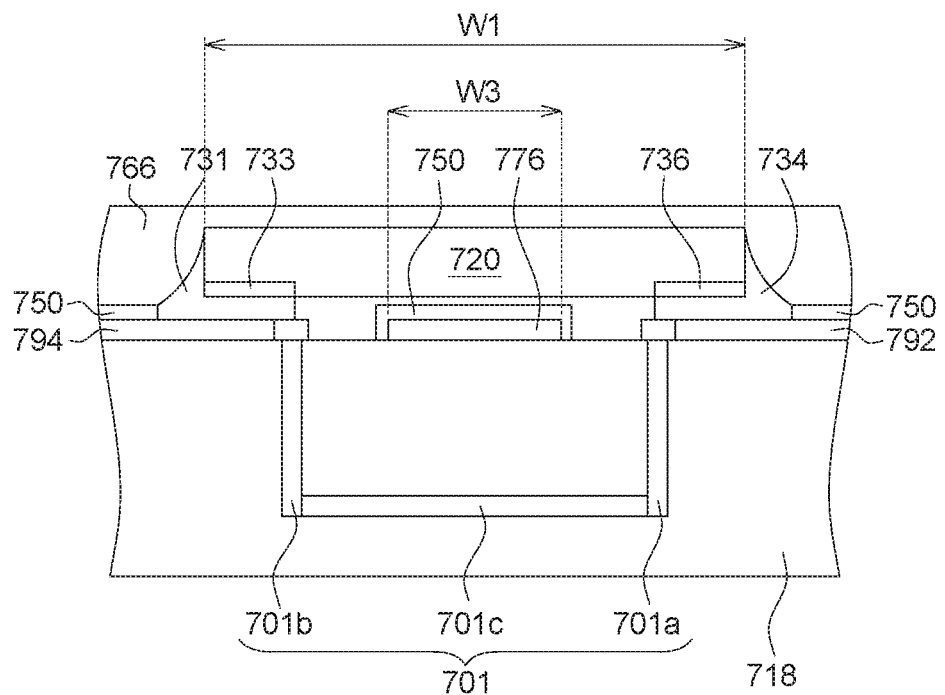
FIG. 7B is a cross-sectional view of the semiconductor package taken along G1G1' line depicted in FIG. 7A.
Figure 7C:
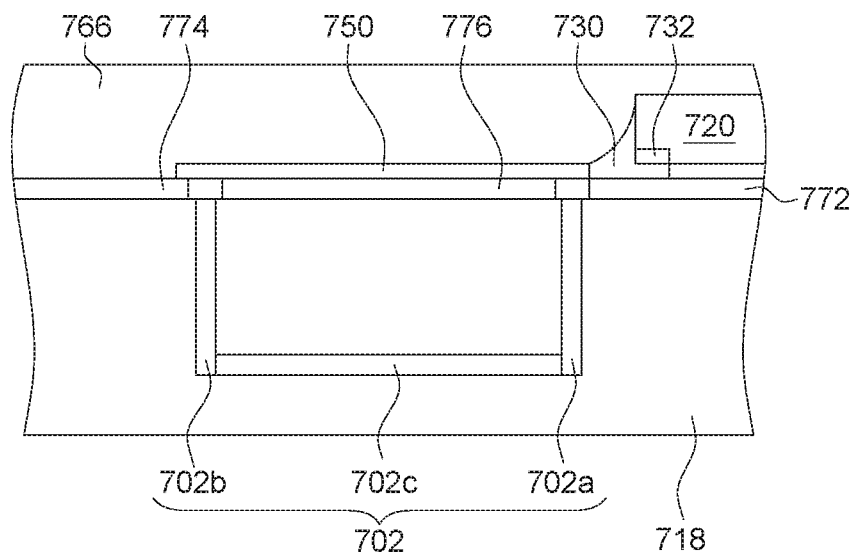
FIG. 7C is a cross-sectional view of the semiconductor package taken along G2G2' line depicted in FIG. 7A.

FIG. 7A is a top view illustrating a semiconductor package, which may be a FC-BGA package shown in FIG. 4 or a wire-bonded BGA package (not shown), in accordance with one embodiment of the invention. FIG. 7B is a cross-sectional view of the semiconductor package taken along G1G1' line depicted in FIG. 7A. FIG. 7C is a cross-sectional view of the semiconductor package taken along G2G2' line depicted in FIG. 7A. As shown in FIG. 7A the semiconductor package includes a substrate 718 having a first patterned conductive layer 770 and a second patterned conductive layer 790 formed thereon. The first patterned conductive layer 770 at least has a first pad 772, a second pad 774 and a connection element 776 electrically connecting the first pad 772 with the second pad 774; and the second patterned conductive layer 790 has a third pad 792, a fourth pad 794 and a fifth pad 796 electrically connecting with each other through the second patterned conductive layer 790. In other words, in the present embodiment, the first pad 772 and the second pad 774 are defined on a continuous layer with the same level; and the third pad 792 the fourth pad 794 and the fifth pad 796 are defined on a continuous layer with the same level.

A first surface mount device (SMD device) 720 disposed on the substrate 718 may be mounted on a first pad 772, the third pad 792 and the fourth pad 794 through a first solder 730, a second solder 734 and a third solder 731, wherein the first solder 730 electrically connects a first electrode 732 of the first surface mount device 720 with the first pad 772; the second solder 734 electrically connects a second electrode 736 of the first surface mount device 720 with the third pad 792; and the third solder 731 electrically connects a third electrode 733 of the first surface mount device 720 with the fourth pad 794. A second surface mount device 721 disposed on the substrate 718 may be mounted on the second pad 774 and the fifth pad 796 through a fourth solder 735 and a fifth solder 739. In the present embodiment, the fourth solder 735 electrically connects a fourth electrode (not shown) of the second surface mount device 721 with the second pad 774, and the fifth solder 739 electrically connects a fifth electrode (not shown) of the second surface mount device 721 with the fifth pad 796.

In some embodiments of the present invention, the first surface mount device 720 has a size substantially equal to that of the second surface mount device 721. But in the present embodiment, the first surface mount device 720 has a size substantially greater than that of the second surface mount device 721. For example, the first surface mount device 720 may have a width W1 substantially ranging from 0.6 to 6.4 mm; and the second surface mount device 721 may have a width W2 substantially ranging from 0.2 to 3.2 mm. In the present embodiment, the first surface mount device 720 preferably has a width W1 about 1 mm and 1 µF (capacitance), and the second surface mount device 721 may have a width W2 about 0.3 mm and 0.1 µF (capacitance). The connection element 776 covered with the solder resistance layer 750 has a width W3 substantially less than or equal to 600 µm (see FIG. 7B).

In some embodiments of the present invention, an interconnection structure 702 (see FIG. 7C) may be used to either substitute the connection element 776 or further electrically connect the first pad 772 with the second pad 774 to reduce their impedance. In one preferred embodiment, the semiconductor package may further include a first interconnection structure 702 and a second interconnection structure 701 respectively used to electrically connect the first pad 772 and the second pad 774 and to electrically connect the third pad 792 and the fourth pad 794 to reduce their impedance.

In the present embodiment, the interconnection structure 701 has a plurality of via-plugs, such as via-plugs 701a and 701b and a metal layer 701c. The via-plugs 701a and 701b respectively in contact with the third pad 792 and the fourth pad 794; and one end of the metal layer 701c directly in contact with the via-plug 701a and the other end of the metal layer 701c directly in contact with the via-plug 701b (see FIG. 7B). The interconnection structure 702 has a plurality of via-plugs, such as via-plugs 702a and 702b and metal layer 702c. The via-plugs 702a and 702b respectively in contact with the first pad 772 and the second pad 774; and one end of the metal layer 702c directly in contact with the via-plug 702a and the other end of the metal layer 702c directly in contact with the via-plug 702b. (see FIG. 7C).

In one embodiment, the first surface mount device 720 and the second surface mount device 721 are decoupling capacitors. The first pad 772 and the second pad 774 are the power pads, and the third pad 792, the fourth pad 794 and the fifth pad 796 are the ground pads.

In some embodiments of the present invention, the semiconductor package may further include a molding compound (shown in FIGS. 7B and 7C, but not shown in FIG. 7A for the sake of brevity) layer encapsulating the structures formed on the substrate 718, such as a portion of the substrate, the first pad 772, the second pad 774, the connection element 776, the third pad 792, the fourth pad 794, the fifth pad 796, the first surface mount device 720 and the second surface mount device 721.

Yet, in some embodiments of the present invention, the semiconductor package may further include a heat-sink mounted (like the one as shown in FIG. 4B) on the substrate 718, having at least one cavity 403 to accommodate the first pad 772, the second pad 774, the connection element 776, the third pad 792, the fourth pad 794, the fifth pad 796, the first surface mount device 720 and the second surface mount device 721.

Figure 8A:
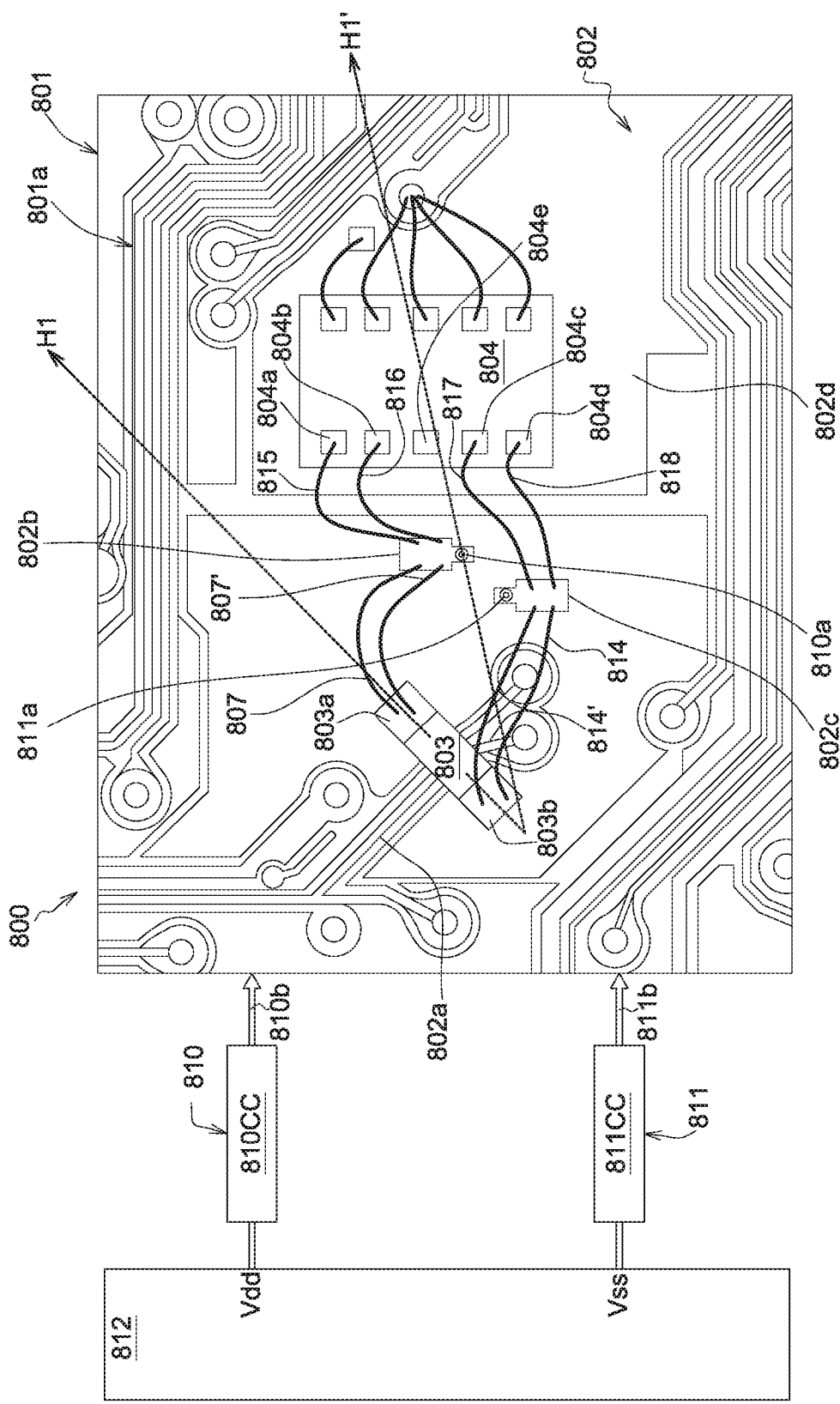
FIG. 8A is a top view illustrating a semiconductor package in accordance with one embodiment of the present disclosure.
Figure 8B:
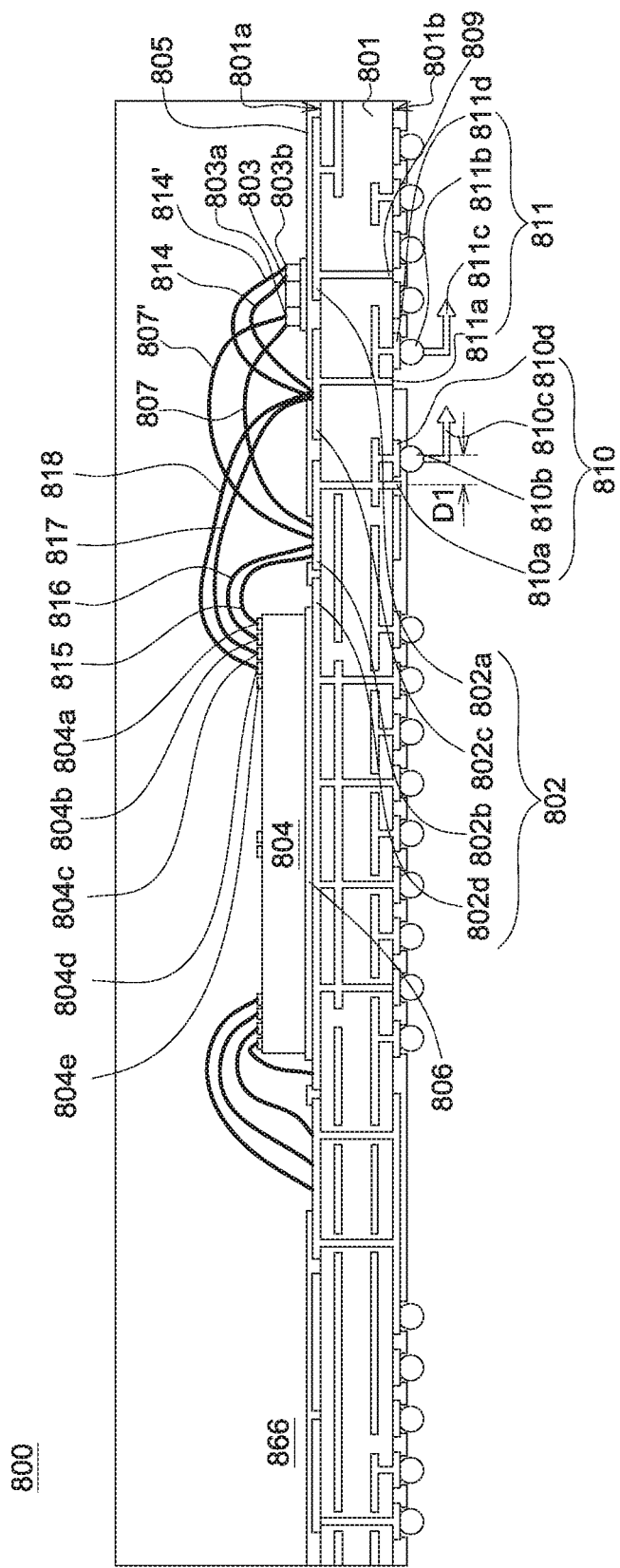
FIG. 8B is a cross-sectional view of the semiconductor package taken along H1H1' line depicted in FIG. 8A.

FIG. 8A is a top view illustrating a semiconductor package 800 in accordance with one embodiment of the present disclosure. FIG. 8B is a cross-sectional view of the semiconductor package 800 taken along H1H1' line depicted in FIG. 8A. In one preferred embodiment, the semiconductor package 800 may be a system-in-package (SiP) including a substrate 801, a conductive layer 802, a SMD 803, a SMD 804, a solder resistance layer 805 and a bonding wire 807.

The substrate 801 may be a PCB, a semiconductor carrier board, or a package substrate such as a BGA substrate or a PGA substrate. The substrate 801 has a top surface 801a and a bottom surface 801b. The conductive layer 802 is formed on the top surface 801a. In some embodiments, the conductive layer 802 is a patterned metal layer made of metal element, such as copper (Cu), aluminum (Al), silver (Ag), gold (Au) or the arbitrary combinations thereof, and includes at least various kinds of separated conductive elements such as traces, guarding rings, fingers, pads, metal planes or plating lines. For example, the plating lines fill up the via-openings of the via-plugs 810a and 811a with the specified metals through the electroplating process.

In the present embodiment, the conductive layer 802 is a patterned copper layer at least having a plurality of signal traces 802a, a power pad 802b, a ground pad 802c and a chip pad 802d. Each of the signal traces 802a may be electrically connected to an internal/external device (not shown) through a fingers or a via-plug 809 penetrating through the substrate 801 for distributing signal. The power pad 802b and the ground pad 802c are electrically to a multi-channel power management integrated circuit (PMIC) 812 through an interconnection 810 and an interconnection 811 respectively.

In some embodiments, the interconnections 810 can be realized by a via-plug 810a, a ball pad 810d, a solder ball 810b and a power plane or trace in a PCB 810c; and the interconnections 811 can be realized by a via-plug 811a, a ball pad 811d, a solder ball 811b and a ground plane or trace in a PCB 811c. The via-plugs 810a and 811a penetrate through the substrate 801 and electrically connected to the power pad 802b and the ground pad 802c respectively. The ball pads 810d and 811d are formed on the bottom surface 801b of the substrate 801 opposite to the first top surface 801a and electrically connected to the via-plugs 810a and 811a respectively. The solder balls 810b and 811b formed on the ball pads 810d and 811d are further electrically connected to the Vdd pins and the Vss pins of the PMIC 812 through the power plane or trace in the PCB 810c and the ground plane or trace in the PCB 811c respectively.

In order to prevent the solder paste from flowing through the via-openings of the via-plugs 810a and 811a in which the via-plugs 810a and 811a are formed to cause shorted traces (not shown) on the bottom surface 801b of the substrate 801, the via-openings of the via-plugs 810a and 811a are preferably filled up by metal or dielectric materials after the via-plugs 810a and 811a are formed. The via-plug 810a and 811a may preferably depart from the solder balls 810b and 811b for a lateral distance D1 substantially less than 5 mm respectively that will achieve less power impedance and IR drop with power supply from the PMIC 812.

The solder resistance layer 805 is formed on the top surface 801a to cover a portion of the conductive layer 802 and define a plurality of bonding areas. For example, in the present embodiment, the solder resistance layer 805 formed on the conductive layer 802 is patterned to expose portions of the power pad 802b and the ground pad 802c, so as to define a boning area on the power pad 802b and define a boning area on the ground pad 802c.

The SMD 803 is mounted on the solder resistance layer 805 with an epoxy paste 819 that is formed on the top surface 801a of the substrate 801; the SMD 803 overlaps with the conductive elements, such as traces, guarding rings, fingers, pads, metal planes or plating lines beneath the solder resistance layer 805, but the SMD 803 is electrically isolated from the conductive elements by the solder resistance layer 805.

In the present embodiment, the SMD 803 can be a surface-mount capacitor with a capacitance from 0.1 µF to 22 µF mounted on the solder resistance layer 805 and overlaps with the signal traces 802a and the via-plug 809 by an epoxy paste 819 but is electrically isolated from the signal traces 802a and the via-plug 809. However, the arrangement of the SMD 803 and the conductive elements are not limited to this regards, any conductive element resulted from the patterned conductive layer 802 formed on the top surface 801a of the substrate 801 may be overlapped by the SMD 803. Similarly, the via-opening of the via-plug 809 is preferably filled up by metal or dielectric materials prior to the mounting of the SMD 803.

In some embodiments of the present disclosure, the SMD 804 may be mounted on and directly contacted to the conductive layer 802 by an epoxy paste layer 806. For example, in the some embodiments of the present disclosure, the SMD 804 can be a surface-mount device, e.g. a capacitor, a resistor, an inductor, a crystal oscillator or an electrostatic discharge (ESD) component, mounted on the chip pad 802d by an epoxy paste layer 806. However, the SMD 804 is not limited to be a surface-mount device. In some other embodiments, the SMD 804 can be a flip chip, such as an application processor (AP), bonded on the patterned conductive layer 802 with solder bumps (not shown).

In the present embodiment, the SMD 803 is a surface-mount capacitor having two electrodes 803a and 803b covered with the noble metal (such as gold, silver, platinum, or palladium), the SMD 804 is a surface mounted chip having a plurality of input/out (I/O) pads 804a, 804b, 804c, 804d and 804e, and the electrodes 803a and 803b of the SMD 803 are both electrically connected to the PMIC 812 and the second SMD 804 by bonding wires respectively. In order to reduce the material cost and improve the wire bondability or solderability and adhesion with epoxy paste in the package, the thickness of the noble metal covered on the electrodes 803a and 803b is preferably less than 6 µm.

For example, the electrode 803a of the SMD 803 is electrically connected to the bonding area defined on the power pad 802b through the bonding wire 807; and the electrode 803b of the SMD 803 is electrically connected to the bonding area defined on the ground pad 802c through the bonding wire 814. In other words, the electrode 803a of the SMD 803 is electrically connected to the PMIC 812 through the bonding wire 807, the power pad 802b of the conductive layer 802 and the interconnection 810; and the electrode 803b of the SMD 803 is electrically connected to the PMIC 812 through the bonding wire 814, the ground pad 802c and the interconnection 811.

However, there may be more than one bonding wires, such as bonding wires 807', used to connect the electrode 803a of the SMD 803 with the power pad 802b and more than one bonding wires, such as bonding wires 814', used to connect the electrode 803b of the SMD 803 with the ground pad 802c. The more wires are bonded or connected, the less power and ground impedance can be achieved.

The bonding area defined on the power pad 802b is electrically connected to the I/O pads 804a and 804b of the SMD 804 by the bonding wires 815 and 816; and the bonding area defined on the ground pad 802c is electrically connected to the I/O pads 804c and 804d of the SMD 804 by bonding wires 817 and 818. In other words, the electrode 803a of the SMD 803 is electrically connected to the SMD 804 through the bonding wires 815 and 816, the power pad 802b of the conductive layer 802 and the bonding wires 807 and 807'; and the electrode 803b of the SMD 803 is electrically connected to the SMD 804 through the bonding wires 817 and 818, the ground pad 802c of the conductive layer 802 and the bonding wires 814 and 814'.

It should be appreciated that the arrangements of the power pad 802b, the ground pad 802c, the SMD 803 and the SMD 804 may not be limited as this regards. In some embodiments of the present disclosure, the relative locations of the power pad 802b, the ground pad 802c, the SMD 803 and the SMD 804 may be different, nevertheless the power pad 802b and the ground pad 802c of the conductive layer 802 as depicted in FIGS. 8A and 8B are disposed between the SMD 803 and the SMD 804, but the arrangement of the power pad 802b and the ground pad 802c is critical to implement both the shorter charging and discharging paths from the PMIC 812, and maintain better power integrity. The via-plug 810a may preferably depart from the bonding location of bonding wires 807' on the power pad 802b for a distance substantially less than 3 mm. The via-plug 811a may preferably depart from the bonding location of bonding wires 814' on the ground pad 802c for a distance substantially less than 3 mm. In some embodiments of the present invention, the semiconductor package may further include a molding compound layer 866 encapsulating the structures formed on the substrate 801, such as a portion of the substrate, the power pad 802b, the ground pad 802c, the bonding wires 807, 814-818, and the SMDs 803 and 804. The semiconductor package of the present embodiment further has a heat-sink (shown in FIG. 4B, but not shown in FIG. 8B for the sake of brevity) mounted on the substrate 801 rather than being encapsulated by a molding compound.

Figure 9:
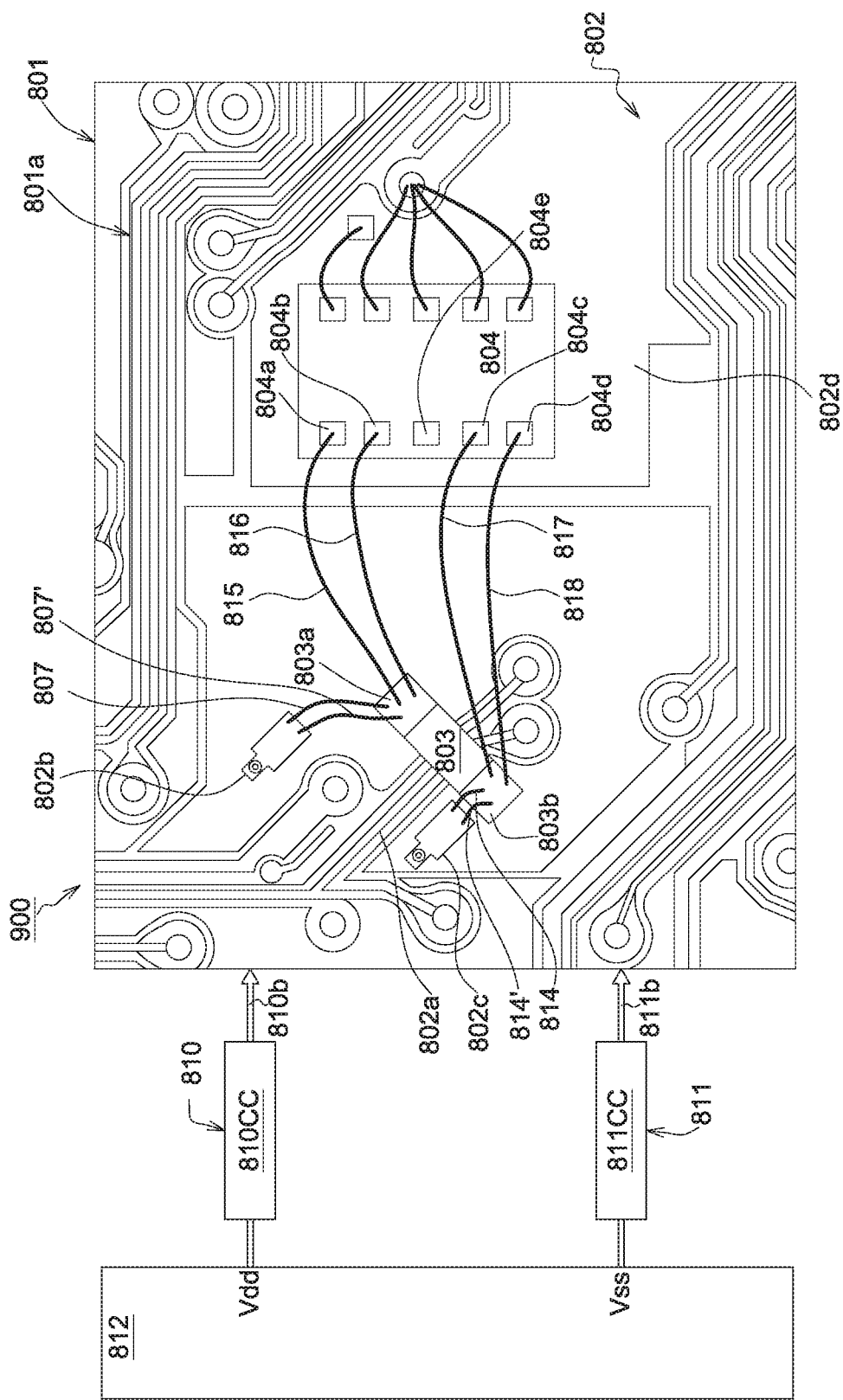
FIG. 9 is a top view illustrating a semiconductor package in accordance with yet another embodiment of the present disclosure.

FIG. 9 is a top view illustrating a semiconductor package 900 in accordance with yet another embodiment of the present disclosure. The semiconductor package 900 is similar to the semiconductor package 800 depicted in FIGS. 8A and 8B, except that the SMD 803 implemented by a surface-mount capacitor is disposed between the SMD 804 implemented by a surface-mount chip and the power pad 802*b*/the ground pad 802*c*. Since the structure of the semiconductor package 800 is similar to that of the semiconductor package 900, thus the identical portions thereof are not redundantly described.

By allocating the power pad 802*b*, the ground pad 802*c*, the SMD 803 and the SMD 804, as discussed in FIGS. 8A, 8B and 9, a better decoupling path with lower impedance can be provided. The direct current (DC) IR droop caused by the path resistance of the electrical connection from the PMIC 812 to the semiconductor package 800 (or 900) in an idle state and an alternating current (AC) dynamic voltage droop caused by the path impedance of a the electrical loop from the power net of PMIC 812 to the semiconductor package 800 (or 900) and then return to the ground net of PMIC 812 can be reduced, while the semiconductor package 800 (or 900) is working, and the power integrity of the semiconductor package 800 (or 900) can be improved.

Besides, because the SMD 803 can be stacked on the signal traces 802*a*, the via-plug 809 or any other conductive elements resulted from the patterned conductive layer 802 formed on the top surface 801*a* of the substrate 801. Applying the SMD 803 serving as a decoupling capacitor may not occupy a large area of the semiconductor package 800 (or 900), in comparison with the conventional approach of which the decoupling capacitor is directly mounted on the conductive layer. Such that the size of the semiconductor package 800 (or 900) can be minimized. In some embodiment of the present disclosure, the SMD 803 can be an integrated passive device (IPD) with at least four electrodes including the power, the ground and the radio frequency (RF) input/output signals, which are electrically connected to the power pad 802*b*, the ground pad 802*c*, the I/O pads on the SMD 804 or signal pads in the conductive layer 802 (not shown).

Figure 10:
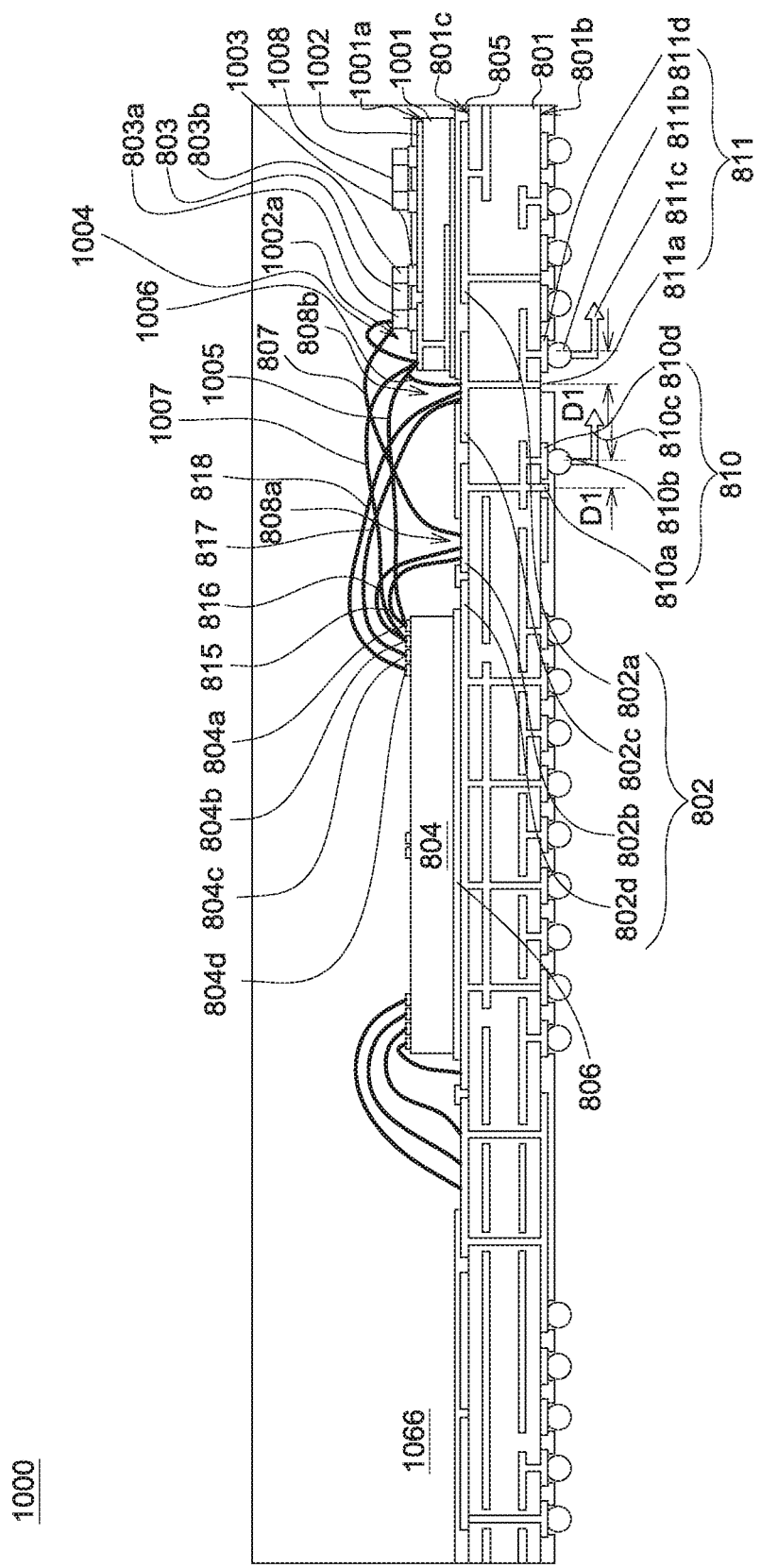
FIG. 10 is a cross-sectional view of the semiconductor package in accordance with one embodiment of the present disclosure.

FIG. 10 is a cross-sectional view of the semiconductor package 1000 in accordance with one embodiment of the present disclosure. The semiconductor package 1000 is similar to the semiconductor package 800 as depicted in FIG. 8B, except that the semiconductor package 1000 further includes a substrate 1001 disposed between the substrate 801 and the SMD 803.

In the present embodiment, the substrate 1001 is mounted on the solder resistance layer 805 that is formed on top surface 801*a* of the substrate 801. The semiconductor package 1000 further includes a conductive layer 1002 formed on a top surface 1001*a* of the substrate 1001 departed from the top surface 801*a* of the substrate 801, and the SMD 803 is mounted on and electrically connected to the conductive layer 1002 by a solder paste layer 1003.

The electrode 803*a* of the SMD 803 is electrically connected to the bonding area defined on the power pad 802*b* through the bonding wire 807; the electrode 803*a* of the SMD 803 is electrically connected to the bonding area 1002*a* defined on the conductive layer 1002 through a boding wire 1004, and the bonding area 1002*a* is then electrically connected to the I/O pad 804*a* of the SMD 804 through a bonding wire 1005. The bonding area 1002*a* is electrically connected to the bonding area defined on the ground pad 802*c* through a bonding wire 1006, and the bonding area 1002*a* is then electrically connected to the I/O pad 804*b* through the boding wire 1007. The electrode 803*b* of the SMD 803 can be electrically connected to the bonding area defined on the power pad 802*b* of the substrate 801 through the traces and the via-plug of the substrate 1001 or through the bonding wire (not shown). In order to reduce the material cost and improve the wire bondability or solderability and adhesion with epoxy paste in the package, the thickness of the noble metal covered on the electrodes 803*a* and 803*b* is preferably less than 6 μm.

In some embodiment of the present disclosure, the semiconductor package 1000 can further include another SMD 1008 mounted on the top surface 1001*a* of the substrate 1001. In the present embodiment, the SMD 1008 is mounted on the conductive layer 1002 and electrically connected to the SMD 803 through the trace of the conductive layer 1002 or through the bonding wire (not shown). The SMD 1008 can be a surface-mounted passive device, such as a capacitor, a resistor, an inductor, a crystal oscillator or an ESD component. Another embodiment of the present disclosure, the SMD 803 can be of integrated passive device (IPD) with at least four electrodes including the power, the ground and the radio frequency (RF) input/output signals, which are electrically connected to the power pad 802*b*, the ground pad 802*c*, the electrodes on the SMD 804 or signal pads in the conductive layer 802 (not shown).

In some embodiments of the present invention, the semiconductor package may further include a molding compound layer 1066 encapsulating the structures formed on the substrate 801, such as a portion of the substrate, the power pad 802*b*, the ground pad 802*c*, the bonding wires 1004-1007, 815-818, the substrate 1001, and the SMDs 803, 804 and 1008. The semiconductor package of the present embodiment further has a heat-sink (shown in FIG. 4B, but not shown in FIG. 10 for the sake of brevity) mounted on the substrate 801 rather than being encapsulated by a molding compound. Since the structure of the semiconductor package 1000 is similar to that of the semiconductor package 800, thus the identical portions thereof are not redundantly described.

Figure 11A:
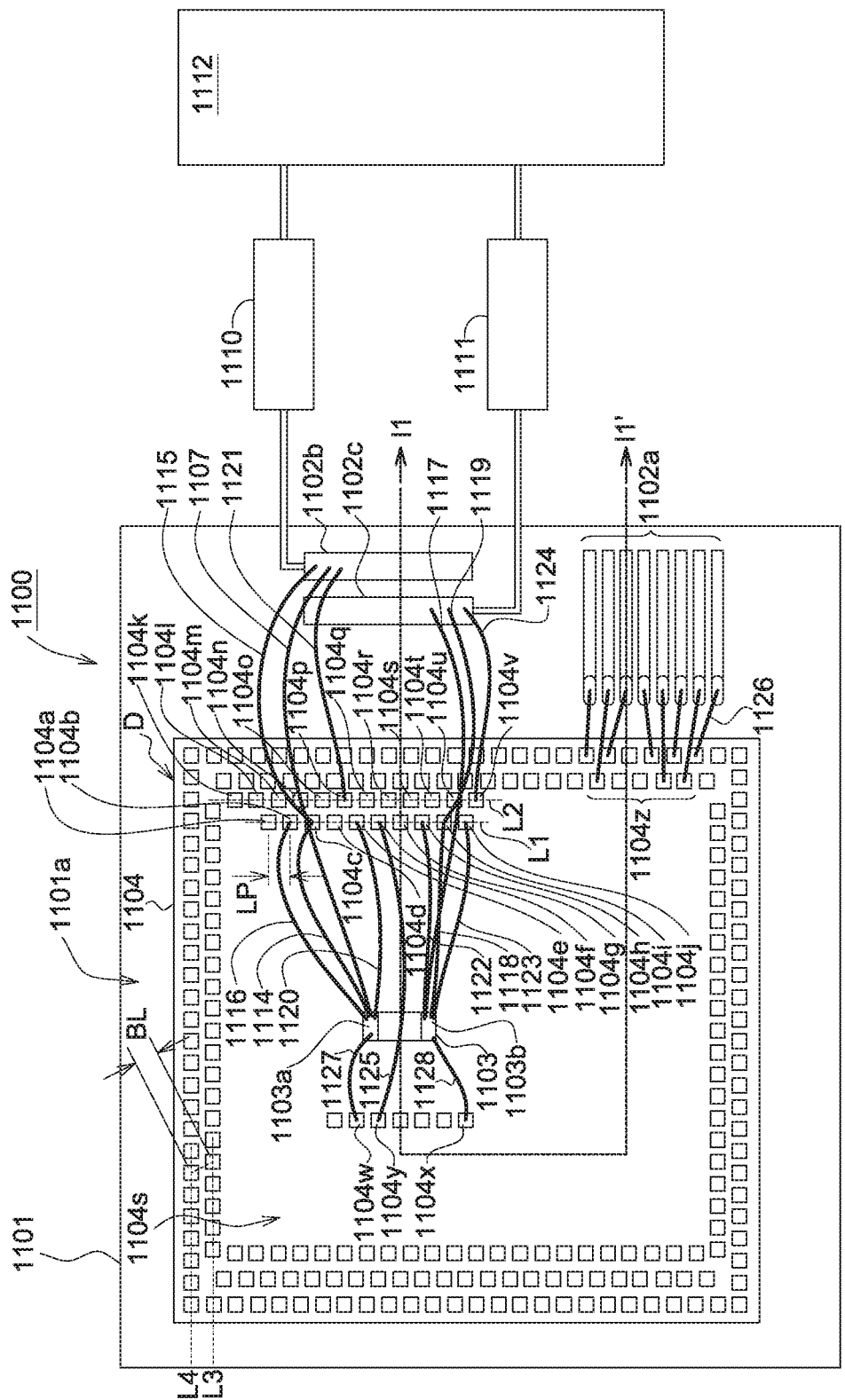
FIG. 11A is a top view illustrating a semiconductor package in accordance with one embodiment of the present disclosure.
Figure 11B:
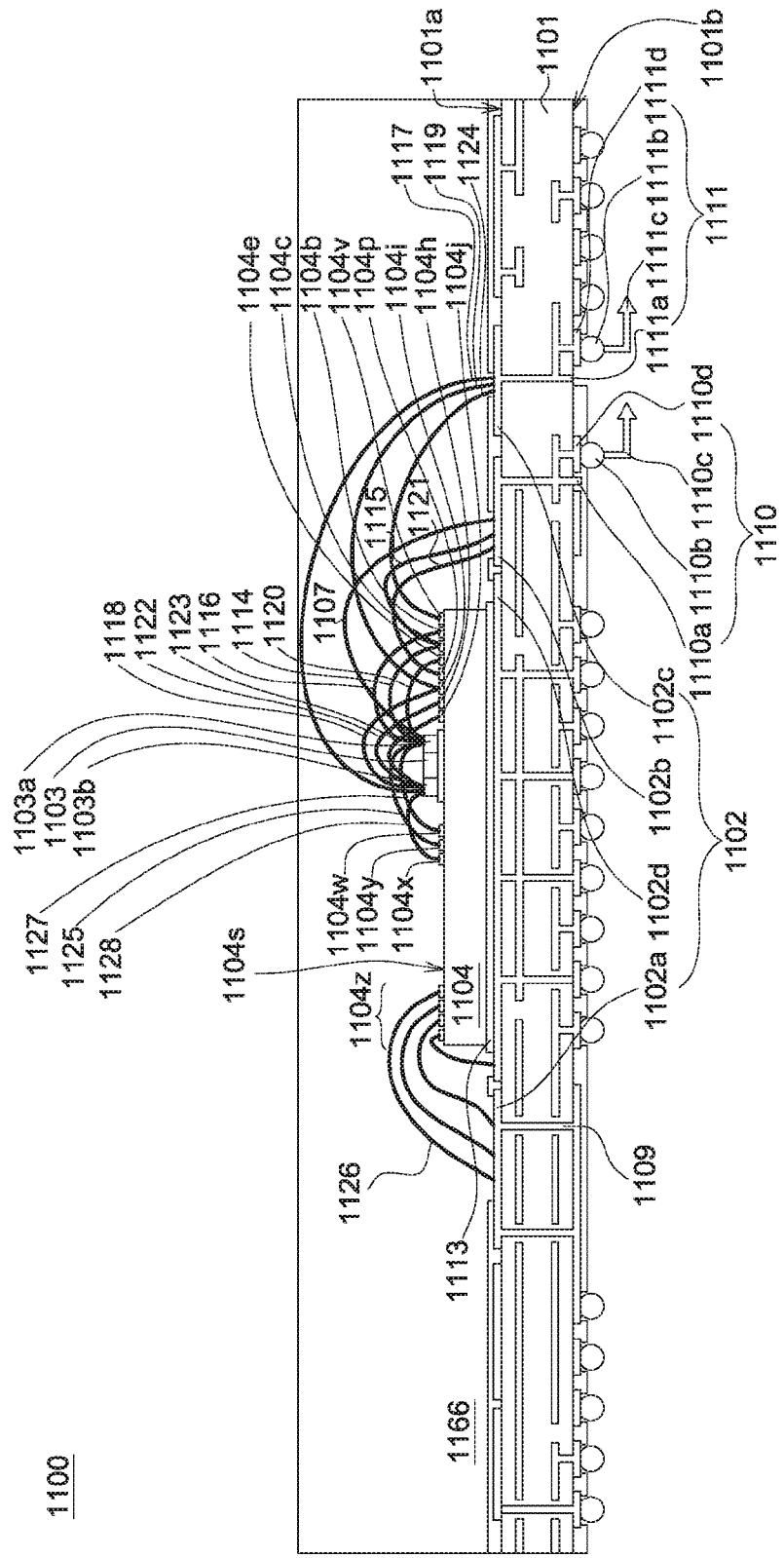
FIG. 11B is a cross-sectional view of the semiconductor package taken along I1I1' line depicted in FIG. 11A.

FIG. 11A is a top view illustrating a semiconductor package 1100 in accordance with one embodiment of the present disclosure. FIG. 11B is a cross-sectional view of the semiconductor package 1100 taken along I1I1' line depicted in FIG. 11A. In one preferred embodiment, the semiconductor package 1100 may be a system-in-package (SiP) including a substrate 1101, a conductive layer 1102, a SMD 1103, a SMD 1104, a bonding wire 1114 and a bonding wire 1115.

The substrate 1101 may be a PCB, a semiconductor carrier board, or a package substrate such as a BGA substrate or a PGA substrate. The substrate 1101 has a top surface 1101*a* and a bottom surface 1101*b*. The conductive layer 1102 is formed on the top surface 1101*a*. In some embodiments, the conductive layer 1102 is a patterned metal layer made of metal element, such as Cu, Al, Ag, Au or the arbitrary combinations thereof, and includes at least various kinds of separated conductive elements such as traces, guarding rings, fingers, pads, metal planes or plating lines.

In the present embodiment, the conductive layer 1102 is a patterned copper layer at least having a plurality of fingers and traces 1102*a*, a power pad 1102*b*, a ground pad 1102*c* and a chip pad 1102*d*. Each of the fingers and traces 1102*a* may be electrically connected to an internal/external device (not shown) through a trace or a via-plug 1109 penetrating through the substrate 1101 for distributing signal. The power pad 1102*b* and the ground pad 1102*c* are electrically connected to a PMIC 1112 through an interconnection 1110 and an interconnection 1111 respectively.

In some embodiments, the interconnection 1110 can be realized by a via-plug 1110*a*, a solder ball 1110*b*, a ball pad 1110*d* and a power plane or trace in a PCB 1110*c*, and the interconnection 1111 can be realized by a via-plug 1111*a*, a solder ball 1111*b*, a ball pad 1111*d* and a ground plane or trace in a PCB 1111*c*. The via-plugs 1110*a* and 1111*a* penetrate through the substrate 1101 and electrically connected to the power pad 1102*b* and the ground pad 1102*c* respectively. The solder balls 1110*b* and 1111*b* are formed on the bottom surface 1101*b* of the substrate 1101 opposite to the top surface 1101*a* and electrically connected to the via-plugs 1110*a* and 1111*a* respectively. The solder balls 1110*b* and 1111*b* are further electrically connected to the power (Vdd) pins and the ground (Vss) pins of the PMIC 1112 through the power plane or trace in the PCB 1110*c* and the ground plane or trace in the PCB 1111*c* respectively.

In some embodiments of the present disclosure, the SMD 1104 may be mounted on and directly contacted to the conductive layer 1102. For example, the SMD 1104 can be, but not limited to, an integrated chip at least including surface-mount passive device e.g. a capacitor, a resistor, an inductor or an ESD component, mounted on the chip pad 1102*d* by an epoxy paste layer 1113. In some other embodiments, the SMD 1104 can be a flip chip, such as a CPU or an application processor (AP), bonded on the patterned conductive layer 1102 with solder bumps (not shown).

In the present embodiment, the SMD 1104 has a size substantially greater than that of the SMD 1103. The SMD 1103 is a surface-mount capacitor with a capacitance from 0.1 μF to 22 μF mounted on a top surface 1104*s* of the SMD 1104 and electrically isolated from the conductive layer 1102 by the SMD 1104. The SMD 1103 has at least two electrodes 1103*a* and 1103*b* covered with the noble metal (such as gold, silver, platinum, or palladium). The SMD 1104 is a surface mounted chip having a plurality of I/O pads 1104*a* . . . 1104*v*, and the electrodes 1103*a* and 1103*b* of the SMD 1103 are both electrically connected to the PMIC 1112 and the second SMD 1104 by bonding wires and the interconnections 1110 and 1111 respectively.

In the present embodiment a plurality of adjacent I/O pads may be united with the power or ground net through the electrical interconnection in the SMD 1104. Therefore, shortening the level and bevel pitches of I/O pads will reduce the power impedance and length of power charging and discharging path. The I/O pads 1104*a* . . . 1104*j* of the SMD 1104 are arranged along a line L1 substantially perpendicular to one side D of the SMD 1104, and each two adjacent ones of the I/O pads 1104*a* . . . 1104*j* have a level pitch LP substantially less than 500 μm. The I/O pads 1104*k* . . . 1104*v* are arranged along a line L2 adjacent to the line L1, and each two adjacent ones of the I/O pads 1104*k* . . . 1104*v* also have the same level pitch LP. In some embodiments, the SMD 1104 may further have a plurality of I/O pads arranged in several lines (e.g. lines L3 and L4) substantially parallel to the side D of the SMD 1104, wherein each two adjacent ones of the I/O pads that are respectively arranged on two parallel lines L1 and L2 (or lines L3 and L4) may not align with each other at a direction perpendicular to (or perpendicular to) the side D of the SMD 1104; and these two adjacent I/O pads may have a bevel pitch BL substantially less than 700 μm.

The electrode 1103*a* of the SMD 1103 covered with the noble metal (such as gold, silver, platinum, or palladium), on one hand, can be electrically connected to the power pad 1102*b* through the bonding wire 1107. On the other hand, the electrode 1103*a* of the SMD 1103 can be electrically connected to the I/O pad 1104*c* of the SMD 1104 through a bonding wire 1114, and the I/O pad 1104*c* is further electrically connected to the power pad 1102*b* through a bonding wire 1115. In other words, the electrode 1103*a* of the SMD 1103 can be electrically connected to the PMIC 1112 either through the bonding wire 1107, the power pad 1102*b* of the conductive layer 1102 and the interconnection 1110 or through the bonding wire 1114, the I/O pad 1104*c*, the bonding wire 1115 the power pad 1102*b* of the conductive layer 1102 and the interconnection 1110.

In another embodiment of the present disclosure, the I/O pad 1104*b* may be electrically connected to the I/O pad 1104*c* by an interconnection or a trace in the SMD 1104 (not shown), and the I/O pad 1104*b* is further electrically connected to the electrode 1103*a* of the SMD 1103 through a bonding wire 1116. Such that, the electrode 1103*a* of the SMD 1103 can also be electrically connected to the PMIC 1112 through the bonding wire 1116, the I/O pad 1104*b*, the I/O pad 1104*c*, the bonding wire 1115, the power pad 1102*b* of the conductive layer 1102 and the interconnection 1110.

In yet another embodiment of the present disclosure, the electrode 1103*a* of the SMD 1103 may be electrically connected to the I/O pad 1104*e* arranged along the line L1 through a bonding wire 1120, the I/O pad 1104*e* is electrically connected to the I/O pad 1104*p* arranged along the other line L2 by an interconnection or a trace in the SMD 1104 (not shown), and the I/O pad 1104*p* is further electrically connected to the power pad 1102*b* through a bonding wire 1121. Such that, the electrode 1103*a* of the SMD 1103 can also be electrically connected to the PMIC 1112 through the bonding wire 1120, the I/O pad 1104*e*, the I/O pad 1104*p*, the bonding wire 1121, the power pad 1102*b* of the conductive layer 1102 and the interconnection 1110.

The electrode 1103*b* of the SMD 1103 covered with the noble metal (such as gold, silver, platinum, or palladium), on one hand, can be electrically connected to the ground pad 1102*c* through the bonding wire 1117. On the other hand, the electrode 1103*b* of the SMD 1103 can be electrically connected to the I/O pad 1104*i* of the SMD 1104 through a bonding wire 1118, and the I/O pad 1104*i* is further electrically connected to the ground pad 1102*c* through the bonding wire 1119. In other words, the electrode 1103*b* of the SMD 1103 can be electrically connected to the PMIC 1112 either through the bonding wire 1117, the ground pad 1102*c* of the conductive layer 1102 and the interconnection 1111 or through the bonding wire 1118, the I/O pad 1104*i*, the bonding wire 1119, the ground pad 1102*c* and the interconnection 1111.

In another embodiment of the present disclosure, the I/O pad 1104*h* may be electrically connected to the I/O pad 1104*i* by an interconnection or a trace in the SMD 1104 (not shown), and the I/O pad 1104*h* is further electrically connected to the electrode 1103*b* of the SMD 1103 through a bonding wire 1122. Such that, the electrode 1103*b* of the SMD 1103 can also be electrically connected to the PMIC 1112 through the bonding wire 1122, the I/O pad 1104*h*, the I/O pad 1104*i*, the bonding wire 1119, the ground pad 1102*c* of the conductive layer 1102 and the interconnection 1111.

In yet another embodiment of the present disclosure, the electrode 1103*b* of the SMD 1103 may be electrically connected to the I/O pad 1104*j* arranged along the line L1 through a bonding wire 1123, the I/O pad 1104*j* is electrically connected to the I/O pad 1104*v* arranged along the other line L2 by an interconnection or a trace in the SMD 1104 (not shown), and the I/O pad 1104*v* is further electrically connected to the ground pad 1102*c* through a bonding wire 1124. Such that, the electrode 1103b of the SMD 1103 can also be electrically connected to the PMIC 1112 through the bonding wire 1123, the I/O pad 1104j, the I/O pad 1104v, the bonding wire 1124, the ground pad 1102c of the conductive layer 1102 and the interconnection 1111.

In the present embodiment, the electrode 1103a of the SMD 1103 may electrically connected to other I/O pad, such as the I/O pad 1104w in the central part of the SMD 1104, through a bonding wire 1127 to provide power source to an internal circuit or electrical element (not shown) built in the SMD 1104. The electrode 1103b of the SMD 1103 may electrically connected to other I/O pad, such as the I/O pad 1104x in the central part of the SMD 1104, through a bonding wire 1128 to provide a ground path to the internal circuit or electrical element (not shown) built in the SMD 1104. There is at least one bonding wire 1125 lying across the SMD 1103 to electrically connect a I/O pad (e.g. the I/O pad 1104f) of the SMD 1104 to another (e.g. I/O pad 1104y in the central part of the SMD 1104). The semiconductor package 1100 may further include a plurality of fingers and traces 1102a formed in the patterned the conductive layer 1102 and electrically connected to the I/O pads 1104z formed in the peripheral region of the SMD 1104 through bonding wires 1126 for distributing other signals. When the SMD 1103 is implemented by a surface-mount capacitor, the electrode 1103a can be the relay of electrical interconnection between the power pad 1102b (or the peripheral I/O pads of the SMD 1104, such as 1104b, 1104c, 1104e, and 1104p) and the I/O pad 1104w in the central part of the SMD 1104 through the bonding wires 1107, 1114-1116, 1120, 1121, and 1127. The electrode 1103b can be the relay of electrical interconnection between the ground pad 1102c (or the peripheral I/O pads of the SMD 1104, such as 1104h, 1104i, 1104j, and 1104v) and the I/O pad 1104x in the central part of the SMD 1104 through the bonding wires 1117-1119, 1122-1124, and 1128. In such embodiment, both the DC power supply and AC power charging paths from the PMIC 1112 can be achieved. The length of bonding wires can be also reduced. Accordingly, both the DC IR droop and AC dynamic voltage droop can be reduced.

In some embodiments of the present invention, the semiconductor package may further include a molding compound layer 1166 encapsulating the structures formed on the substrate 1101, such as a portion of the substrate, the power pad 1102b, the ground pad 1102c, the bonding wires 1107, 1114-1128, and the SMDs 1103 and 1104. The semiconductor package of the present embodiment further has a heat-sink (shown in FIG. 4B, but not shown in FIG. 11B for the sake of brevity) mounted on the substrate 1101 rather than being encapsulated by a molding compound.

Figure 12:
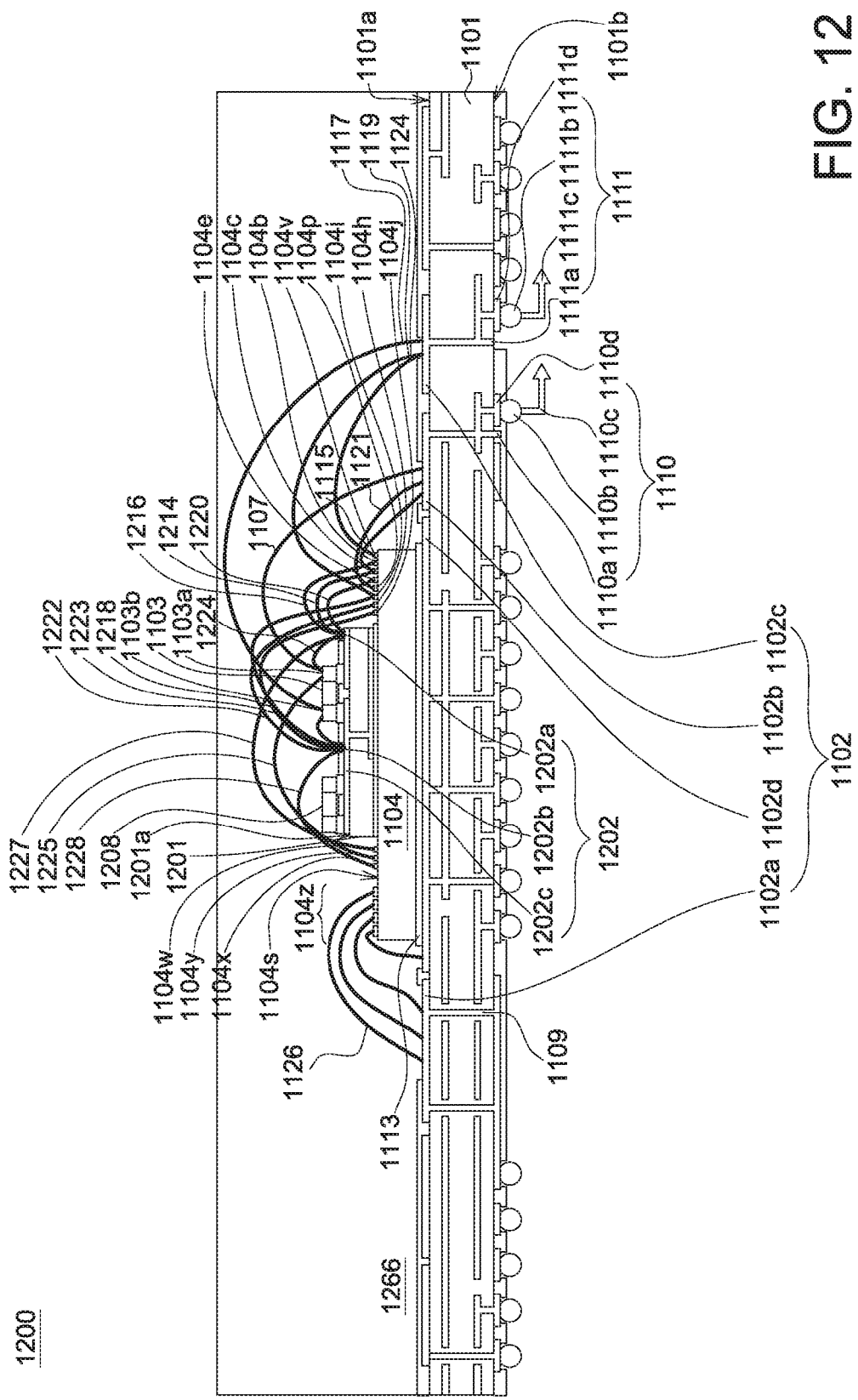
FIG. 12 is a cross-sectional view of the semiconductor package in accordance with one embodiment of the present disclosure.

FIG. 12 is a cross-sectional view of the semiconductor package 1200 in accordance with one embodiment of the present disclosure. The semiconductor package 1200 is similar to the semiconductor package 1100 as depicted in FIG. 11B, except that the semiconductor package 1200 further includes a substrate 1201 disposed between the substrate 1101 and the SMD 1103.

In the present embodiment, the substrate 1201 is mounted on the top surface 1104s of the SMD 1104. The semiconductor package 1200 further includes a conductive layer 1202 formed on a top surface 1201a of the substrate 1201 departed from the top surface 1104s of the SMD 1104, and the SMD 1103 is mounted on and electrically connected to the conductive layer 1202 by a solder paste layer.

The bonding wire arrangement of the semiconductor package 1200 is similar to that of the semiconductor package 1100, except that the bonding wires 1114, 1116, 1120 and 1127 that are used to electrically connecting the electrode 1103a of the SMD 1103 with the SMD 1104, as depicted in FIGS. 11A and 11B, are substituted by a bonding wire 1224 electrically connecting the electrode 1103a with a bonding area 1202a defined on the conductive layer 1202 and a plurality of bonding wires 1214, 1216, 1220 and 1227 electrically connecting the bonding area 1202a to the I/O pads 1104c, 1104b, 1104e and 1104w of the SMD 1104 respectively; and except that the bonding wires 1118, 1122, 1123 and 1128 that are used to electrically connecting the electrode 1103b of the SMD 1103 with the SMD 1104, as depicted in FIGS. 11A and 11B, are substituted by a bonding wire 1225 electrically connecting the electrode 1103b with a bonding area 1202b defined on the conductive layer 1202 and a plurality of bonding wires 1218, 1222, 1223 and 1228 electrically connecting the I/O pads 1104i, 1104h, 1104j and 1104x of the SMD 1104 respectively.

In some embodiment of the present disclosure, the semiconductor package 1200 may further include another SMD 1208 mounted on the top surface 1201a of the substrate 1201. In the present embodiment, the SMD 1208 is mounted on the conductive layer 1202 and electrically connected to the SMD 1103 through a trace 1202c of the conductive layer 1202. The SMD 1208 can be a surface-mounted passive device, such as a capacitor, a resistor, an inductor, a crystal oscillator or an ESD component. In some embodiment of the present disclosure, the SMD 1103 can be an integrated passive device (IPD) with at least four electrodes including the power, the ground and the radio frequency (RF) input/output signals, which are electrically connected to the power pad 1102b, the ground pad 1102c, the I/O pads on the SMD 1104 or signal fingers and traces 1102a in the conductive layer 1102.

Since the structure of the semiconductor package 1200 is similar to that of the semiconductor package 1100, thus the identical portions thereof are not redundantly described. By allocating the power pad 1102b, the ground pad 1102c, the SMD 1103 and the SMD 1104, as discussed in FIGS. 11A, 11B and 12, a better decoupling path with lower impedance can be provided. The DC IR droop caused by the path resistance of the electrical connection from the PMIC 1112 to the semiconductor package 1100 (or 1200) in an idle state and an AC dynamic voltage droop caused by the path impedance of a the electrical loop from the power net of PMIC 1112 to the semiconductor package 1100 (or 1200) and then return to the ground net of PMIC 1112 can be reduced, while the semiconductor package 1100 (or 1200) is working, and the power integrity of the semiconductor package 1100 (or 1200) can be improved.

In some embodiments of the present invention, the semiconductor package may further include a molding compound layer 1266 encapsulating the structures formed on the substrate 1101, such as a portion of the substrate, the power pad 1102b, the ground pad 1102c, the bonding wires 1107, 1115, 1117, 1119, 1121, 1124, 1126, 1214, 1216, 1218, 1220, 1222-1224, 1227, 1228, the substrate 1201, and the SMDs 1103, 1104 and 1208. The semiconductor package of the present embodiment further has a heat-sink (shown in FIG. 4B, but not shown in FIG. 12 for the sake of brevity) mounted on the substrate 1101 rather than being encapsulated by a molding compound.

According to the present disclosure, the semiconductor package has at least following advantages. Miniaturization of IC packages is facilitated. In addition, an extra area for additional elements, devices or routing density is increased. Therefore, design flexibility of the semiconductor package is enhanced.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
   a first substrate having a first top surface;
   a first conductive layer formed on the first top surface and having a first conductive element and a second conductive element separated from each other;
   a first surface mount device (SMD) mounted on the first top surface, overlapping with and electrically isolated from the first conductive element; and
   a first bonding wire electrically connect the first SMD with the first conductive layer.

2. The semiconductor package according to claim 1, further comprising:
   a solder resistance layer covering a portion of the first conductive layer and allowing the first SMD mounted thereon;
   a second SMD mounted on and directly contacted to the second conductive element; and
   a second bonding wire electrically connecting the second SMD with the first conductive layer.

3. The semiconductor package according to claim 2, wherein the first conductive layer further comprises:
   a first bonding area of a third conductive element defined by the solder resistance layer on the first conductive layer and electrically connected to a power circuit through a first interconnection; and
   a second bonding area of a fourth conductive element defined by the solder resistance layer on the first conductive layer and electrically connected to a ground circuit through a second interconnection.

4. The semiconductor package according to claim 3, wherein the first SMD comprises:
   a first electrode electrically connected to the first bonding area through the first bonding wire; and
   a second electrode electrically connected to the second bonding area through a third bonding wire.

5. The semiconductor package according to claim 3, wherein the second SMD comprises:
   a first input/out (I/O) pad electrically connected to the first bonding area through the second bonding wire; and
   a second I/O pad electrically connected to the second bonding area through a fourth bonding wire.

6. The semiconductor package according to claim 3, wherein the first interconnection comprises:
   a via-plug passing through the first substrate; and
   a ball pad formed on a bottom surface of the first substrate opposite to the first top surface, electrically connected to the via-plug, and departed from the via-plug for a lateral distance substantially less than 5 mm.

7. The semiconductor package according to claim 1, further comprising a second substrate mounted on the first top surface; wherein the first SMD is mounted on a second top surface of the second substrate departed from the first top surface.

8. The semiconductor package according to claim 7, further comprising:
   a second conductive layer formed of the second top surface;
   a fifth bonding wire electrically connecting the first conductive layer with the second conductive layer; and
   a sixth bonding wire electrically connecting the first SMD with the second conductive layer.

9. The semiconductor package according to claim 7, further comprising a third SMD mounted on the second top surface and electrically connected to the first SMD.

10. A semiconductor package, comprising:
    a first substrate having a first top surface;
    a first conductive layer formed on the first top surface and having a first conductive element and a second conductive element separated from each other;
    a first surface mount device (SMD) mounted on the first top surface, overlapping with and electrically isolated from the first conductive element;
    a first bonding wire electrically connect the first SMD with the first conductive layer; and
    a second SMD having a second top surface disposed between the first substrate and the first SMD, through which the first SMD is mounted on the second top surface and electrically isolated from the first conductive element.

11. The semiconductor package according to claim 10, wherein the first SMD comprises:
    a first electrode electrically connected to a first I/O pad of the second SMD through the first bonding wire; and
    a second electrode electrically connected to a second I/O pad of the second SMD through a third bonding wire.

12. The semiconductor package according to claim 11, wherein the first conductive layer comprises a power pad and a ground pad, and the first I/O pad is electrically connected to the power pad through a fourth bonding wire and further electrically connected to a power circuit through a first interconnection; and the second I/O pad is electrically connected to the ground pad through a fifth bonding wire and further electrically connected to a ground circuit through a second interconnection.

13. The semiconductor package according to claim 12, wherein the second SMD further comprises a third I/O pad disposed adjacent to the first I/O pad and electrically connected to the first electrode by a sixth bonding wire.

14. The semiconductor package according to claim 13, wherein the third I/O pad and the first I/O pad are arranged along a line substantially parallel to one side of the second SMD and have a level pitch substantially less than 500 μm.

15. The semiconductor package according to claim 12, wherein the second SMD further comprises a third I/O pad, the third I/O pad and the first I/O pad are respectively arranged in two lines substantially parallel to one side of the second SMD and has a bevel pitch substantially less than 700 μm.

16. The semiconductor package according to claim 13, wherein the second SMD further comprises a third and a fourth I/O pads disposed on one side of the first SMD, which are opposite to the first and the second I/O pads, the third I/O pad electrically connected to the first electrode through a seventh bonding wire and the fourth I/O pad electrically connected to the second electrode through an eighth bonding wire.

17. The semiconductor package according to claim 10, further comprising:
    a second substrate mounted on the second top surface of the second SMD; and
    a first SMD element mounted on a third top surface of the second substrate departed from the second SMD.

18. The semiconductor package according to claim 17, further comprising:

a second conductive layer formed of the third top surface; and a ninth bonding wire electrically connecting the second conductive layer with the second top surface of the second SMD.

19. The semiconductor package according to claim 18, further comprising a third SMD mounted on the third top surface and electrically connected to the first SMD.

20. The semiconductor package according to claim 17, wherein a tenth bonding wire electrically connecting the first SMD with the first conductive layer.

\* \* \* \* \*